United States Patent
Lim et al.

(10) Patent No.: US 9,240,404 B2
(45) Date of Patent: Jan. 19, 2016

(54) EMBEDDED POLYSILICON RESISTOR IN INTEGRATED CIRCUITS FORMED BY A REPLACEMENT GATE PROCESS

(71) Applicant: Texas Instruments Incorporated, Dallas, TX (US)

(72) Inventors: Kwan-Yong Lim, Plano, TX (US); Ki-Don Lee, Plano, TX (US); Stanley Seungchul Song, San Diego, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/492,406

(22) Filed: Sep. 22, 2014

(65) Prior Publication Data

US 2015/0008531 A1 Jan. 8, 2015

Related U.S. Application Data

(62) Division of application No. 13/736,558, filed on Jan. 8, 2013, now Pat. No. 8,865,542.

(60) Provisional application No. 61/747,783, filed on Dec. 21, 2012.

(51) Int. Cl.

| H01L 27/06 | (2006.01) |
|---|---|
| H01L 29/66 | (2006.01) |
| H01L 49/02 | (2006.01) |
| H01L 29/49 | (2006.01) |
| H01L 29/78 | (2006.01) |

(52) U.S. Cl.
CPC .......... *H01L 27/0629* (2013.01); *H01L 28/20* (2013.01); *H01L 29/4966* (2013.01); *H01L 29/66575* (2013.01); *H01L 29/7833* (2013.01)

(58) Field of Classification Search
CPC .................................................. H01L 29/66575
USPC .................................................. 257/380, 904
See application file for complete search history.

(56) References Cited

U.S. PATENT DOCUMENTS

| 6,406,956 | B1 | 6/2002 | Tsai et al. | |
|---|---|---|---|---|
| 7,994,576 | B2* | 8/2011 | Tseng | H01L 27/0629 |
| | | | | 257/380 |
| 8,062,966 | B2 | 11/2011 | Mehrad et al. | |
| 8,361,848 | B2 | 1/2013 | Lee et al. | |
| 8,377,790 | B2* | 2/2013 | Kanike | H01L 23/5256 |
| | | | | 257/E21.004 |

* cited by examiner

*Primary Examiner* — Chandra Chaudhari
(74) *Attorney, Agent, or Firm* — Jacqueline J. Garner; Frank D. Cimino

(57) ABSTRACT

An embedded resistor structure in an integrated circuit that can be formed in a replacement gate high-k metal gate metal-oxide-semiconductor (MOS) technology process flow. The structure is formed by etching a trench into the substrate, either by removing a shallow trench isolation structure or by silicon etch at the desired location. Deposition of the dummy gate polysilicon layer fills the trench with polysilicon; the resistor polysilicon portion is protected from dummy gate polysilicon removal by a hard mask layer. The resistor polysilicon can be doped during source/drain implant, and can have its contact locations silicide-clad without degrading the metal gate electrode.

4 Claims, 26 Drawing Sheets

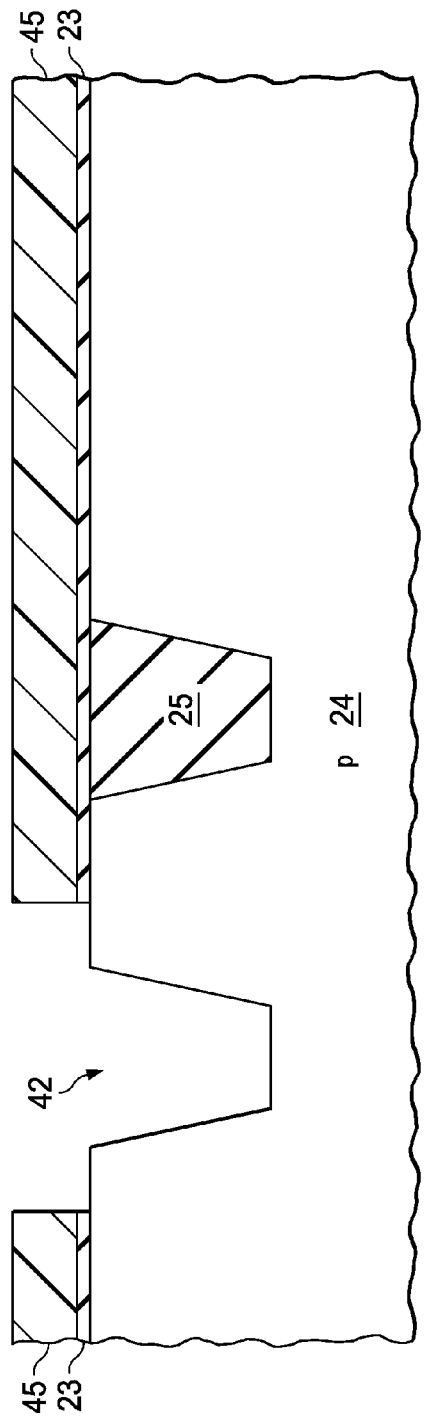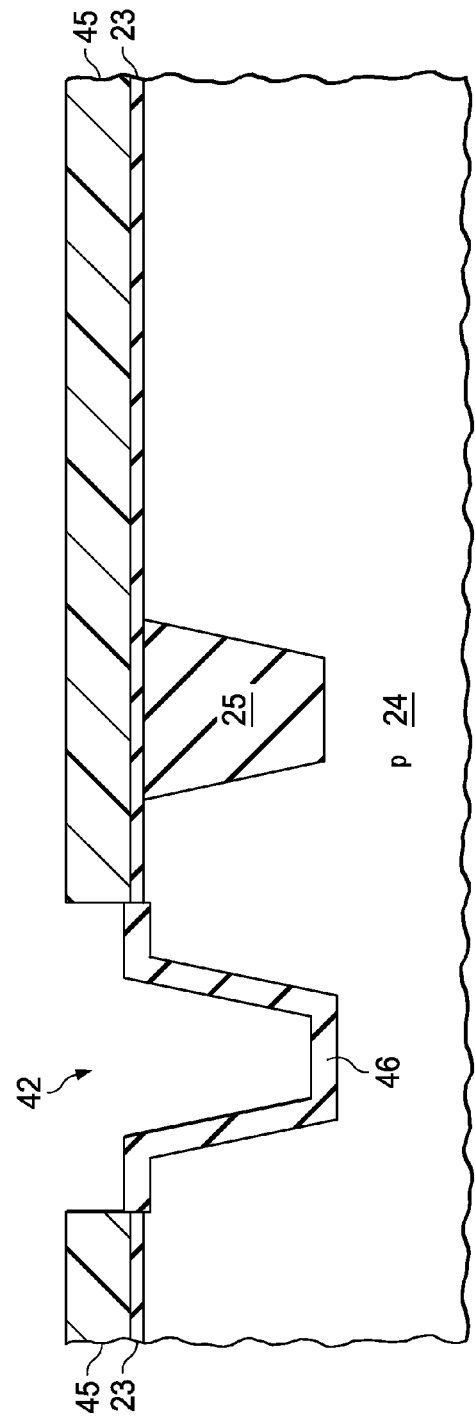
FIG. 4a
FIG. 4b

EMBEDDED POLYSILICON RESISTOR IN INTEGRATED CIRCUITS FORMED BY A REPLACEMENT GATE PROCESS

CROSS-REFERENCE TO RELATED APPLICATIONS

This application is a divisional of U.S. Nonprovisional Patent Application Ser. No. 13/736,558, filed Jan. 8, 2013, and claims the priority of U.S. provisional application Ser. No. 61/747,783, filed Dec. 21, 2012, the contents of which are herein incorporated by reference in its entirety.

BACKGROUND OF THE INVENTION

This invention is in the field of integrated circuits and their manufacture. Embodiments of this invention are more particularly directed to integrated resistor structures constructed by advanced metal-oxide-semiconductor (MOS) technologies.

Many modern electronic devices and systems now include substantial computational capability for controlling and managing a wide range of functions and useful applications. As is fundamental in the art, reduction in the size of physical feature sizes of structures realizing transistors and other solid-state devices enables greater integration of more circuit functions per unit "chip" area, or conversely, reduced consumption of chip area for a given circuit function. The capability of integrated circuits for a given cost has greatly increased as a result of this miniaturization trend.

Advances in semiconductor technology in recent years have enabled the shrinking of the minimum device feature size (e.g., the width of the gate electrode of a metal-oxide-semiconductor (MOS) transistor, which defines the transistor channel length) into the extreme sub-micron range. State of the art transistor channel lengths are now approaching the sub-20 nanometer regime, which is on the same order of magnitude as the source and drain depletion widths. This scaling of MOS transistor feature sizes into the deep submicron realm has necessitated the thinning of the MOS gate dielectric layer, if conventional gate dielectric layers (e.g., silicon dioxide) are used, to an extent that can be problematic from the standpoint of gate current leakage, manufacturing yield and reliability. In response to this limitation of conventional gate dielectric material, so-called "high-k" gate dielectrics, such as hafnium oxide ($HfO_2$), have become popular. These dielectrics have higher dielectric constants than silicon dioxide and silicon nitride, permitting those films to be physically thicker than corresponding silicon dioxide films while remaining suitable for use in high performance MOS transistors. Gate electrodes of metals and metal compounds, such as titanium nitride, tantalum-silicon-nitride, tantalum carbide, and the like are now also popular in modern MOS technology, especially in combination with these high-k gate dielectrics. These metal gate electrodes eliminate the undesired polysilicon depletion effect, which is particularly noticeable at the extremely small feature sizes required of these technologies.

A popular technique for fabricating integrated circuits with high-k metal gate MOS transistors is referred to in the art as the "replacement gate" processes. In a general sense, replacement gate processes form polysilicon MOS transistors in the conventional manner, including the defining of polycrystalline silicon ("polysilicon") gate electrodes overlying a gate dielectric film, and the formation of source and drain regions in a self-aligned manner relative to those polysilicon gate electrodes. According to the replacement gate approach, those "dummy" polysilicon gate electrodes and the underlying "dummy" gate dielectric film are removed after implant of the source and drain regions, followed by deposition of high-k gate dielectric material and metal gate material at the locations previously occupied by the polysilicon gate electrode and gate dielectric. Chemical-mechanical polishing (CMP) of the deposited metal gate material planarizes the top surface of the gate electrode with the surrounding interlevel dielectric structures. By way of further background, commonly owned U.S. Pat. No. 8,062,966, issued Nov. 22, 2011, entitled "Method for Integration of Replacement Gate in CMOS Flow", and incorporated herein by this reference, describes a high-k metal gate structure and process, according to which CMOS integrated circuits are constructed using a replacement gate process.

Resistor structures are now commonly implemented in many modern ultra-large scale integrated circuits. Polysilicon is an attractive material for use in forming these integrated resistors, especially as compared with metal materials. Polysilicon structures can be formed with relatively high resistivity, which reduces the area required to implement large value resistors as compared with metal resistor structures, and thus also reduces the parasitic inductance of those structures. Because polysilicon structures are typically dielectrically isolated from the underlying silicon substrate, polysilicon resistors generally have much lower parasitic capacitance than diffused resistors.

As known in the art, many integrated circuits include metal silicide cladding of silicon elements such as polysilicon transistor gate electrodes, polysilicon interconnects, and diffused regions, to improve the conductivity of those structures. Conventionally, this metal silicide cladding is performed by deposition of a metal (e.g., cobalt, titanium, tungsten) over the silicon structures followed by a high-temperature anneal to react that metal with the underlying silicon. The unreacted metal is then etched from those locations at which it was not in contact with underlying silicon. But silicide-cladding of polysilicon resistors is generally undesirable because of the resulting reduction in resistivity of the resistor structure. It has also been observed that unclad polysilicon resistors exhibit significantly more linear behavior with temperature than do silicide-clad polysilicon resistors, facilitating temperature compensation in sensitive circuits such as voltage reference circuits and the like.

Accordingly, conventional integrated circuits that are constructed with silicide-clad polysilicon conductors will still include unclad polysilicon resistors. Differentiation between the silicide-clad and unclad structures is conventionally accomplished by depositing a "silicide-block" dielectric film over the polysilicon conductors, followed by a masked etch of the silicide block film to expose those polysilicon conductors that are to be silicide-clad, and to protect those that are not to be clad (i.e., the resistor structures) from the direct react silicidation. However, it is cumbersome to incorporate the formation of unsilicided polysilicon resistors in conventional replacement gate process flows for forming integrated circuits with high-k metal gate transistors.

FIGS. 1a through 1g illustrate a conventional replacement gate process in which a polysilicon resistor is also constructed, beginning with a partially fabricated portion of a high-k metal gate CMOS integrated circuit as shown in cross-section in FIG. 1a. The structure of FIG. 1a is shown at a surface location of p-type single-crystal silicon substrate 4. P-type substrate 4 may be a portion of a p-type "well" formed by masked ion implantation into the substrate, or may simply be a location of a p-type substrate itself, in either case constituting locations at which n-type MOS transistors will be formed. Isolation dielectric structure 5, in the form of a shallow trench isolation (STI) structure, is disposed at the surface of substrate 4 for isolating transistors from one another. "Dummy" gate dielectric layer 7, for example of silicon dioxide, is disposed over the surface of substrate 4, over which polysilicon layer 8 is in turn disposed; "dummy" gate electrodes and a polysilicon resistor will be formed from this polysilicon layer 8 according to this conventional approach. Hard mask layer 9, for example of silicon nitride, overlies polysilicon layer 8 in this structure.

At the stage of manufacture shown in Figure 1b, polysilicon structures 8 overlying remnants of dummy gate dielectric 7 have been formed by a masked etch of hard mask layer 9, followed by etch of polysilicon layer 8 and dummy gate dielectric layer 7 at those locations from which hard mask layer 9 were removed. Those polysilicon structures 8 formed at locations of the surface of substrate 4, and the underlying dummy gate dielectric at those locations will serve as dummy structures, and will not become part of the finished integrated circuit. Polysilicon structure 8' is disposed over the surface of shallow trench isolation structure 5, and will form a polysilicon resistor in this conventional approach. Ion implantation has been applied to this structure after the formation of polysilicon structures, resulting in n-type drain extension regions 11 that are self-aligned with polysilicon structures 8, 8'.

FIG. 1c illustrates the structure after the deposition of sidewall dielectric layer 13 overall, followed by ion implantation of n+ source/drain regions 10 in a self-aligned manner relative to polysilicon structures 8, 8' and sidewall dielectric structures formed in layer 13 along the sides of polysilicon structures 8, 8'. At the stage of manufacture shown in FIG. 1c, interlevel dielectric layer 14, for example of silicon dioxide, has been deposited overall. The structure is then planarized, for example by CMP, to a sufficient depth that remaining portions of hard mask layer 9 are removed, resulting in the surface interlevel dielectric 14 being substantially coplanar with the surface of polysilicon structures 8, 8', as shown in FIG. 1d.

Also as shown in FIG. 1d, polysilicon resistor structure 8' is protected by hard mask feature 15, formed of a layer of deposited silicon nitride or the like subjected to a masked etch. Dummy gate polysilicon structures 8 and the underlying dummy gate dielectric layer 7 are then removed by a blanket etch, resulting in the structure shown in FIG. 1e. Polysilicon resistor structure 8' remains in place at this stage, protected by hard mask feature 15.

Following removal of dummy gate polysilicon structures 8 and dummy gate dielectric 7, high-k dielectric layer 17 is deposited overall (typically overlying a thin interface layer, not shown), followed by the deposition of metal gate layer 18 overall (typically overlying a barrier metal layer, not shown), resulting in the structure of FIG. 1f. High-k dielectric 17 is formed by chemical vapor deposition (CVD) or atomic layer deposition (ALD) of $HfO_2$ or other similar high-k dielectric materials known in the art. Metal gate layer 18 is a layer of a metal or conductive metal compound that by its composition or by doping has a work function suitable for serving as the gate for MOS transistors of the desired conductivity type and with the desired threshold voltage. This structure is then subjected to CMP to remove metal gate layer 18 except from within those locations within openings of interlevel dielectric 14 previously occupied by dummy gate structures 8, to form the gate electrodes of the transistors at these locations, as shown in FIG. 1g. Overlying dielectric material and one or more metal conductor layers are then deposited overall, with contact openings formed through the dielectric material to interconnect the transistor gate structures 18, polysilicon resistor 8, source/drain regions 10, and other structures as desired for the eventual circuit.

It is useful to form a metal silicide cladding at the surface of those locations of polysilicon resistor 8' at which overlying metal conductors will make contact to ensure good ohmic contact, while leaving the remainder of polysilicon resistor 8' unsilicided. However, silicidation of any part of the surface of polysilicon resistor 8' at this stage of manufacture is difficult because the post-silicidation removal of unreacted metal degrades the conductivity of contacts to metal gate electrodes 18. Furthermore, incorporation of the polysilicon resistor structure in these conventional replacement gate processes necessitates two additional photomasks: one for masking ion implantation of the resistor structure (i.e., to attain the correct resistivity) and another for forming the hard mask feature protecting resistor structure 8' from the dummy gate removal etch. It has been further observed that adequate protection of non-silicided polysilicon resistor structures is even more difficult in those replacement gate process flows in which CMP is used to planarize the metal gate material, causing significant variability in the resistance presented by the polysilicon resistors.

BRIEF SUMMARY OF THE INVENTION

Embodiments of this invention provide a polysilicon resistor structure and a method of fabricating the same in an integrated circuit that is compatible with modern high-k metal gate replacement gate manufacturing processes.

Embodiments of this invention provide such a structure and method in which resistive heat is dissipated more efficiently than in conventional polysilicon resistor structures.

Embodiments of this invention provide such a structure and method that may be incorporated into a manufacturing process flow without adding a photolithographic mask with critical dimension and alignment requirements.

Embodiments of this invention provide such a structure and method in which doping of the polysilicon structure can readily be performed, in some cases by an existing ion implant step for other structures.

Other objects and advantages of embodiments of this invention will be apparent to those of ordinary skill in the art having reference to the following specification together with its drawings.

Embodiments of this invention can be implemented into an integrated circuit with high-k metal gate transistors and a replacement gate method of fabricating the same in which the material of a polysilicon resistor structure is deposited into a trench in the silicon surface during the dummy gate polysilicon deposition. Subsequently deposited interlevel dielectric material protects the resistor structure from the dummy gate removal etch, and from other subsequent processes such as metal gate chemical-mechanical polishing.

In some embodiments of the invention, the polysilicon resistor structure is formed into the location of a shallow trench isolation (STI) structure from which the dielectric material is first removed.

In some embodiments of the invention, the polysilicon resistor structure is formed into a trench etched into the single-crystal silicon at a location determined by photolithography.

In some embodiments of the invention, the trench is subjected to thick oxidation prior to deposition of the polysilicon material.

BRIEF DESCRIPTION OF THE SEVERAL VIEWS OF THE DRAWING

FIGS. 4a through 4d are cross-sectional views of a portion of an integrated circuit structure at various stages in its manufacture according to another embodiment of the invention.

DETAILED DESCRIPTION OF THE INVENTION

The present invention will be described in connection with its embodiments, namely as implemented into a metal-oxide-semiconductor (MOS) integrated circuit and manufacturing technology in which high-k metal gate MOS transistors are constructed by a replacement gate process, as it is contemplated that this invention will be especially beneficial when applied to such an implementation. However, it is contemplated that this invention can provide important advantages and benefits also in other integrated circuit applications. Accordingly, it is to be understood that the following description is provided by way of example only, and is not intended to limit the true scope of this invention as claimed.

Figure 2A:
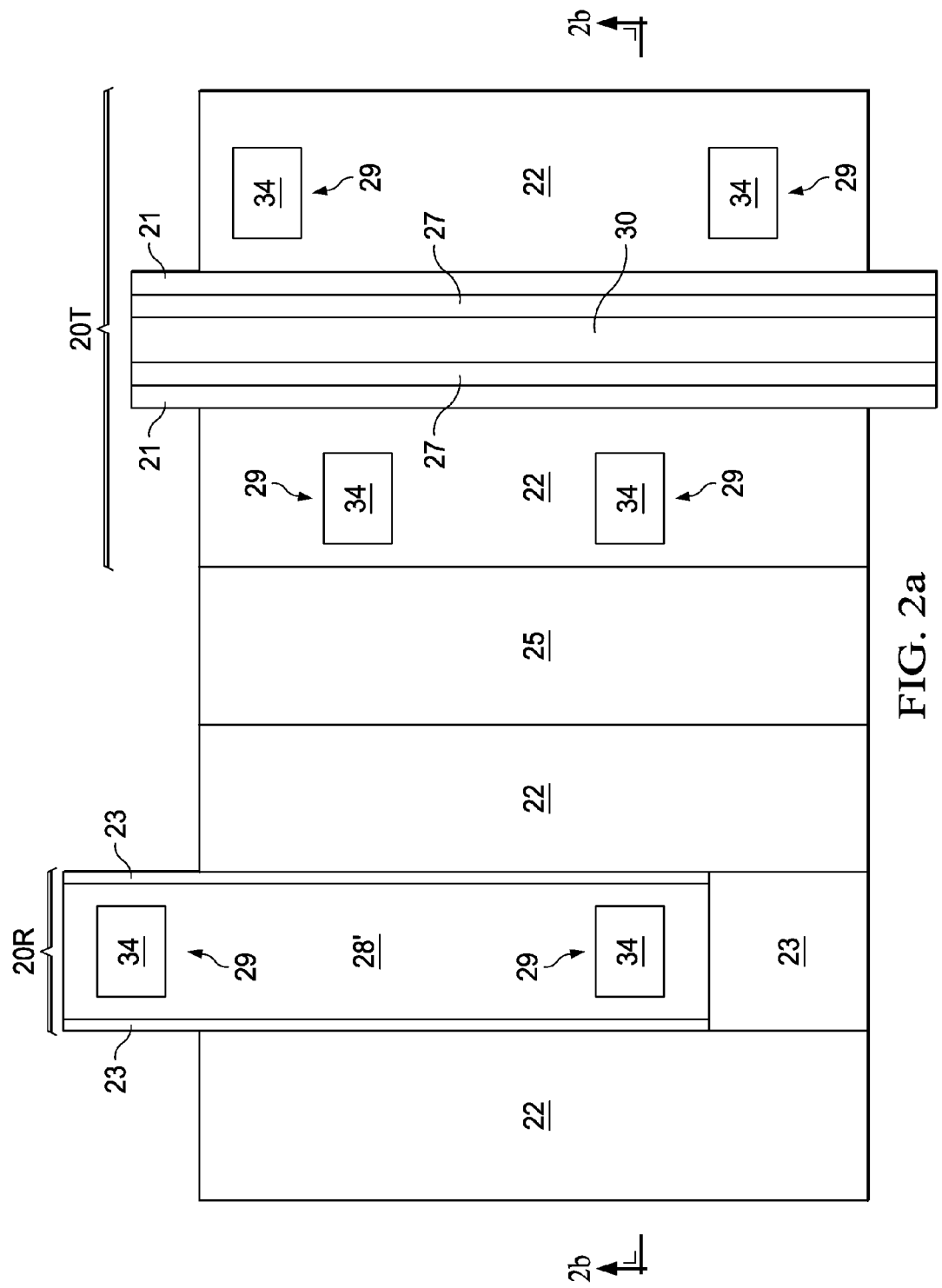
FIGS. 2a and 2b are plan and cross-sectional views, respectively, of a portion of an integrated circuit structure according to embodiments of the invention.
Figure 2B:
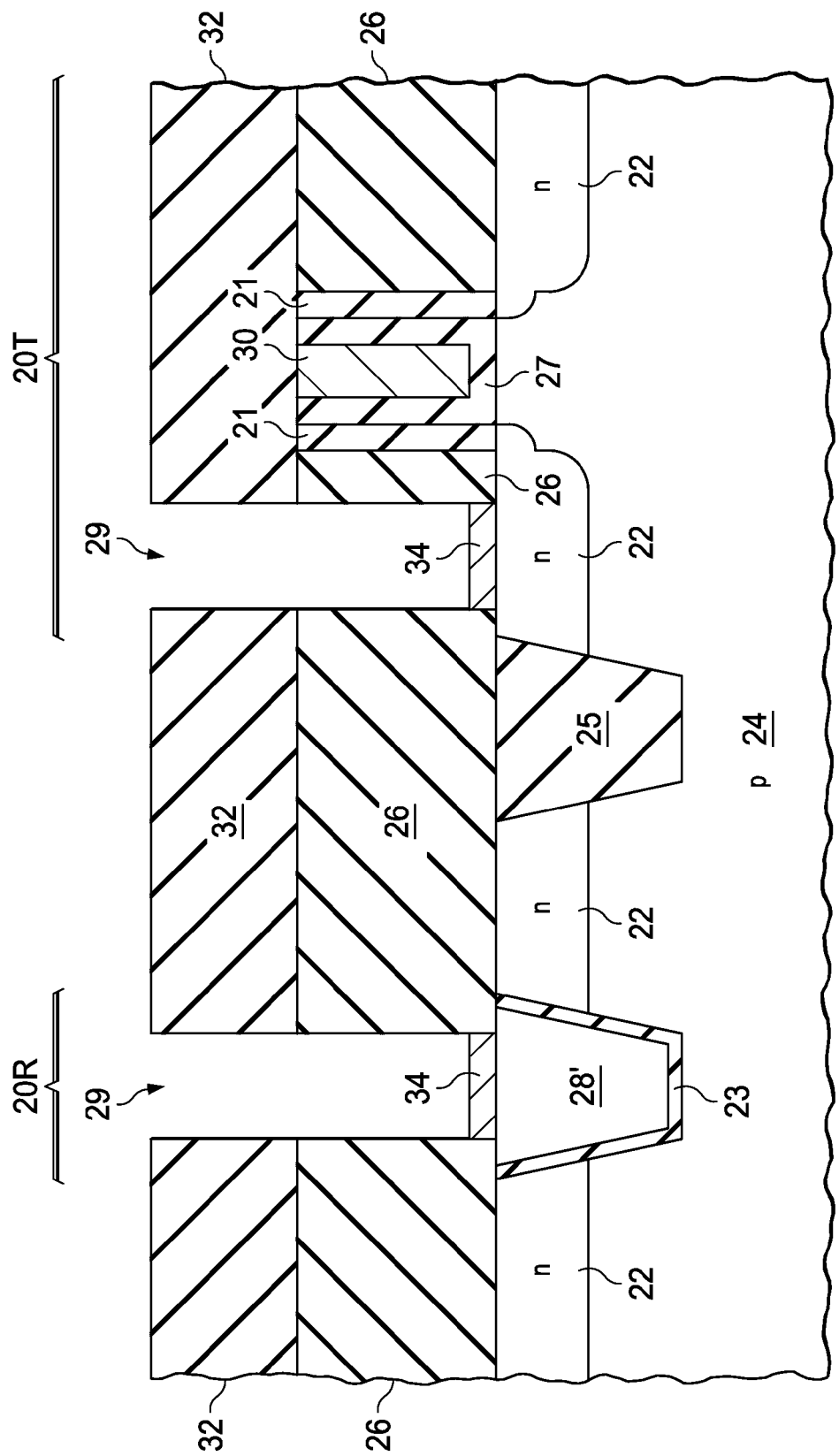

FIGS. 2a and 2b illustrate, in plan and cross-sectional views, respectively, the construction of MOS transistor 20T and resistor 20R in a MOS integrated circuit according to embodiments of this invention. While these Figures show transistor 20T and resistor 20R located adjacent to one another, it is of course contemplated that these devices may be located at a larger distance from one another, and may or may not have an electrical relationship with one another (i.e., may not be in the same electrical circuit). In addition, as fundamental in the art, many transistors and resistors constructed similarly as transistor 20T and resistor 20R described herein will typically be constructed within the same integrated circuit, varying in size (channel width, channel length, etc.) and shape according to the layout and desired electrical characteristics. In addition, while embodiments of this invention will be described with reference to an n-channel transistor 20T, it is of course contemplated that transistor 20T may alternatively be constructed as a p-channel MOS transistor, and further that both re-channel and p-channel implementations of transistor 20T may be present in the same integrated circuit.

In this example, n-channel MOS transistor 20T is constructed within a p-type region 24 of a single-crystal silicon substrate, or alternatively within an implanted p-type well formed into a single-crystal silicon substrate, or within a p-type region of a silicon-on-insulator film. For simplicity of this description, examples of the embodiments of the invention described herein will refer to p-type region 24 as substrate 24, referring generally to the single-crystal silicon surface in any of these or other forms at which the devices are formed. Transistors such as transistor 20T are isolated and separated from one another at the surface of substrate by instances of isolation dielectric structure 25. According to embodiments of this invention, isolation dielectric structure 25 is constructed as a shallow trench isolation (STI) structure, consisting of a dielectric material (e.g., silicon nitride or silicon dioxide) deposited into a trench etched into selected locations of the surface of substrate 24.

As shown in FIGS. 2a and 2b, transistor 20T includes metal gate electrode 30 overlying high-k gate dielectric film 27, which in turn overlies a portion of substrate 24. Sidewall dielectric layer 21 is present on the sides of first interlevel dielectric layer 26 adjacent to metal gate electrode 30, and typically consists of silicon nitride. Heavily-doped n-type implanted regions 22 are disposed into the surface of substrate 24 on opposing sides of metal gate electrode 30, and constitute the source and drain regions of n-channel transistor 20T.

As shown in FIG. 2b, interlevel dielectric layer 26 is disposed over the surface of source/drain regions 22 and over isolation dielectric structure 25, at a thickness corresponding to the thickness of metal gate electrode 30. A second interlevel dielectric layer 32 overlies the first interlevel dielectric layer 26. These interlevel dielectric layers 26, 32 are not shown (i.e., are invisible) in FIG. 2a for clarity. Contact openings 29 are formed through at selected locations of interlevel dielectric layers 24, 32 to allow subsequently deposited and patterned conductors to make electrical contact to source/drain regions 22. Metal silicide cladding 34 is disposed at the locations of contact openings 29 extending to source/drain regions 20 to ensure good ohmic contact with those conductors; silicide cladding 34 may extend over the entire surface of source/drain region 20, if desired, to also reduce the effective resistivity of these regions. Other contact openings (not shown) are etched through second interlevel dielectric layer 32 to allow those conductors to make electrical contact to gate electrode 30.

While not evident from FIG. 2b, metal gate electrode 30 and high-k gate dielectric layer 27 are each typically formed as a laminated structure of several different physical layers. High-k gate dielectric layer 30 may include an interface dielectric layer, for example a thermal silicon dioxide or a deposited dielectric film such as silicon nitride or silicon dioxide, in contact with the surface of p-type region 24 between dielectric spacers 29. High-k gate dielectric 27 also includes a layer of a dielectric material with a relatively high dielectric constant as compared with silicon dioxide or silicon nitride; typical high-k dielectric materials suitable for use as high-k gate dielectric 27 include hafnium oxide ($HfO_2$), hafnium zirconium oxide ($HfZrO_x$), and combinations of high-k materials, such as hafnium oxide in combination with zirconium oxide (e.g., $HfO_2/ZrO_2$ and $ZrO_2/HfO_2$). Other high-k dielectric materials known in the art may alternatively be used in embodiments of this invention. When constructed in laminated fashion, metal gate electrode 30 may include relatively thin layer of a barrier metal in contact with high-k gate dielectric 27, above which the desired metal for the gate electrode is disposed. The barrier metal is provided to limit interdiffusion between the overlying metal material of metal gate electrode 30 and high-k gate dielectric 27, and is typically composed of a metal from the lanthanide series (e.g., lanthanum, cerium, praseodymium, neodymium, promethium, samarium, europium, gadolinium, ytterbium), or a conductive metal compound thereof (e.g., lanthanum oxide). The primary metal of metal gate electrode 30 typically consists of an elemental metal, ternary metal, metal alloy, or conductive metal compound that is selected or doped to have a work function suitable for the desired electrical parameters (i.e., threshold voltage) of n-channel transistor 20T, examples of which include tantalum, titanium, hafnium, zirconium, tungsten, molybdenum, and their nitride and carbide compounds; silicon nitride, aluminum nitride, and aluminum silicon nitride compounds; and combinations thereof. The thicknesses and materials used for high-k gate dielectric 27 and metal gate electrode 30 will typically vary for n-channel transistors from that used for p-channel transistors, to form a gate having the proper work function for each device. Additional layers of barrier metal and "fill" metal may also be used to form metal gate electrode 30, depending on the particular manufacturing process (i.e., additional metal layers may be added in a CMOS process flow).

According to embodiments of this invention, resistor 20R is formed of polysilicon element 28' disposed within a trench into the surface of substrate 24. In the example of FIG. 2b, the shape of polysilicon element 28' resembles that of isolation dielectric structure 25 due to the manner of its formation; in other embodiments of the invention, polysilicon element 28' does not necessarily so resemble the shape of an isolation dielectric structure 25. Dielectric layer 23 is disposed between substrate 24 and polysilicon element 28, electrically isolating resistor 20R from substrate 24. Metal silicide cladding 34, at those locations of the surface of polysilicon element 28 at which contact openings 29 are formed through interlevel dielectric layers 26, 32, ensures ohmic contact between polysilicon element 28 and subsequently formed metal conductors (not shown) extending through contact openings 29. It is contemplated that the full surface of polysilicon element 28 will generally not be silicide-clad, to minimize the chip area required for resistor 20R to realize the desired resistance value.

Figure 1A:
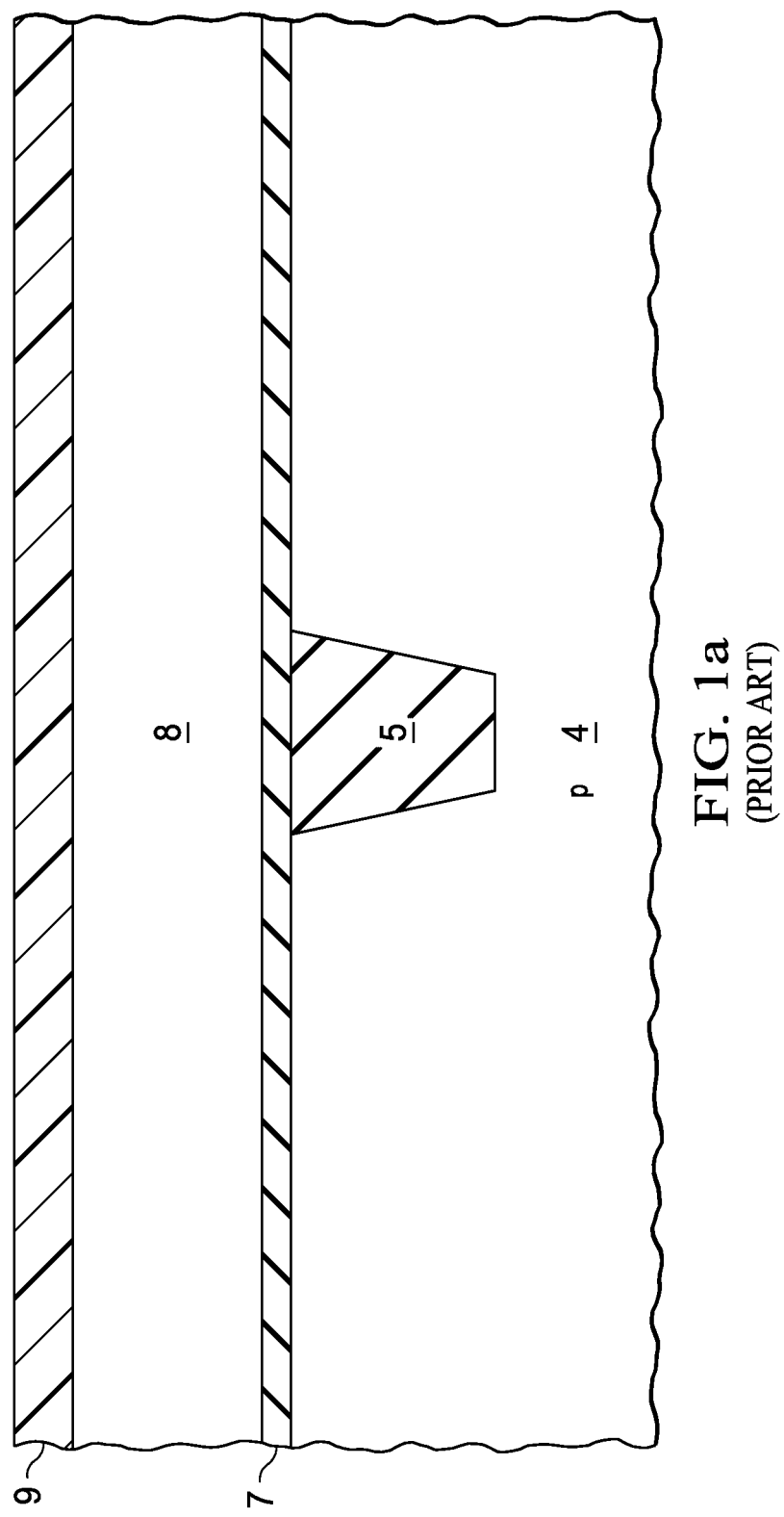
FIGS. 1a through 1g are cross-sectional views of a portion of an integrated circuit structure at stages in its manufacture according to a conventional manufacturing process flow.
Figure 1B:
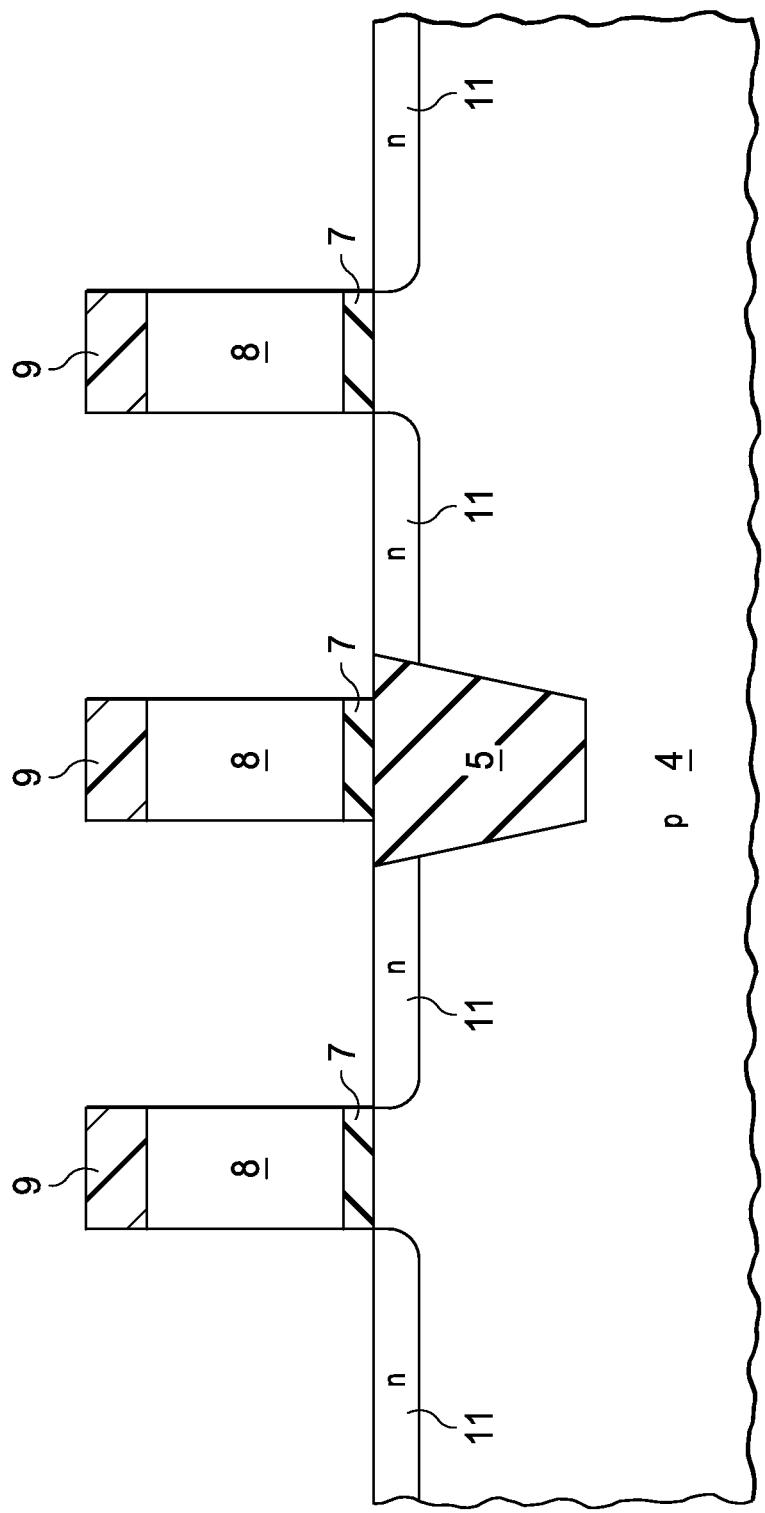
Figure 1C:
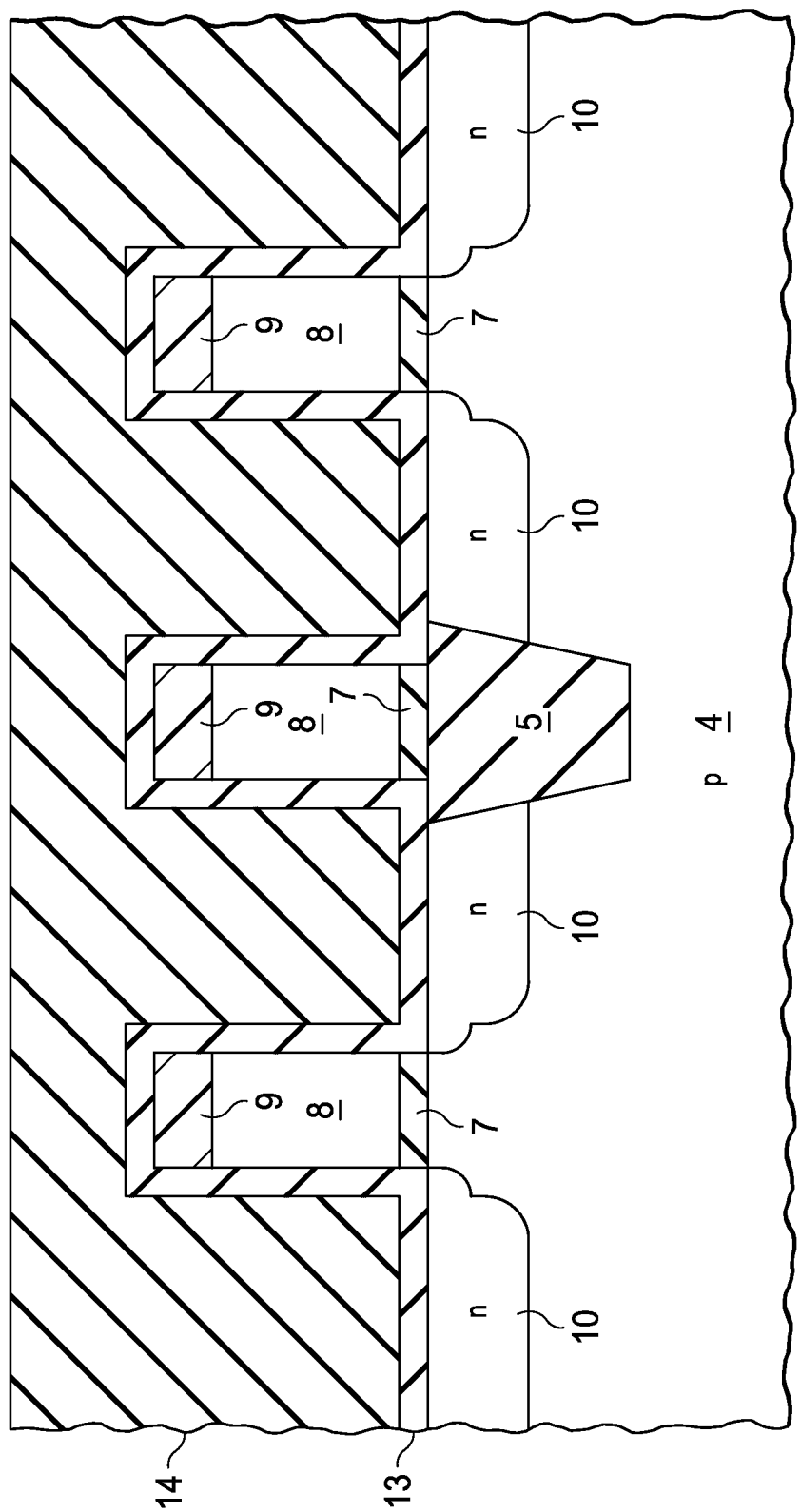
Figure 1D:
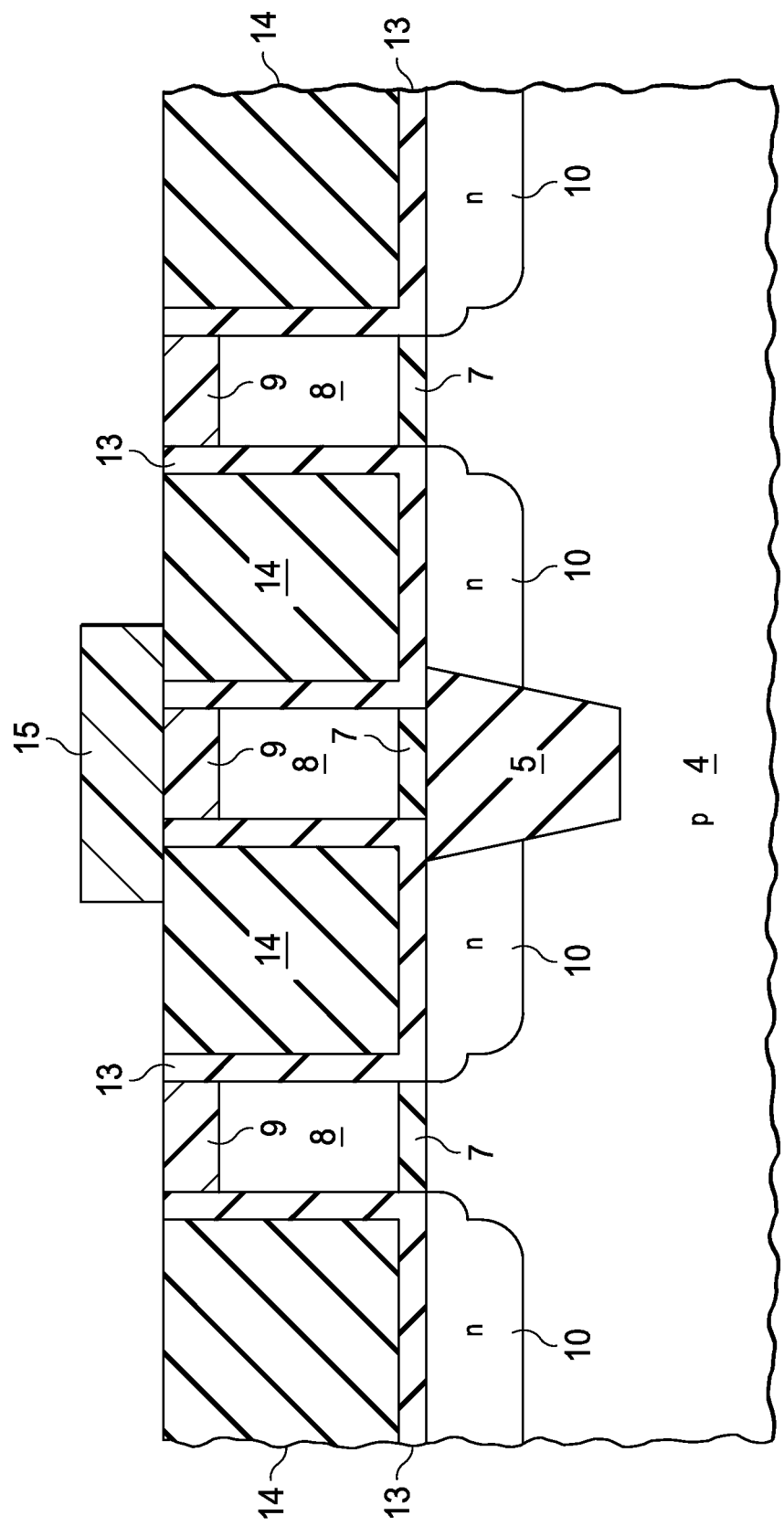
Figure 1E:
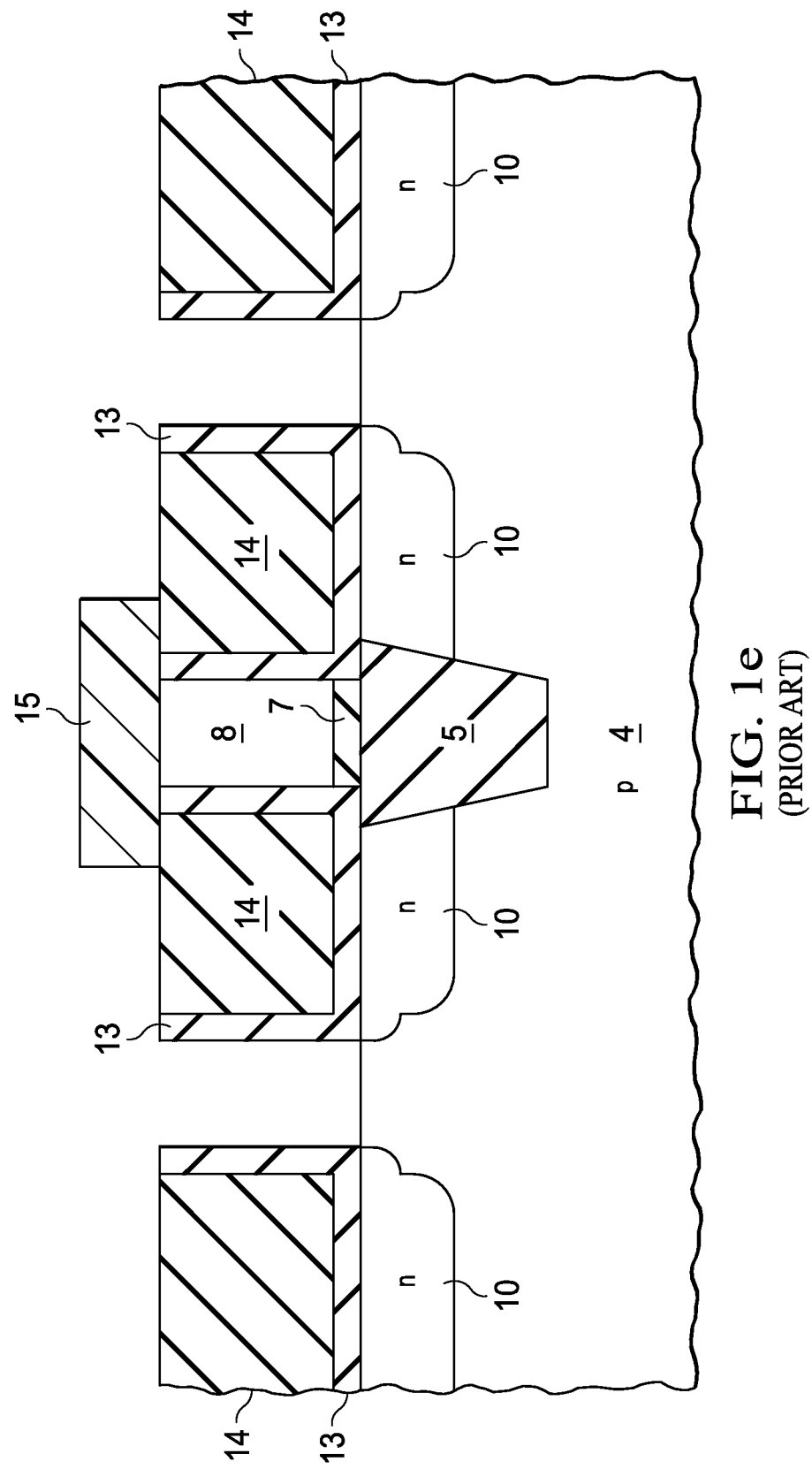
Figure 1F:
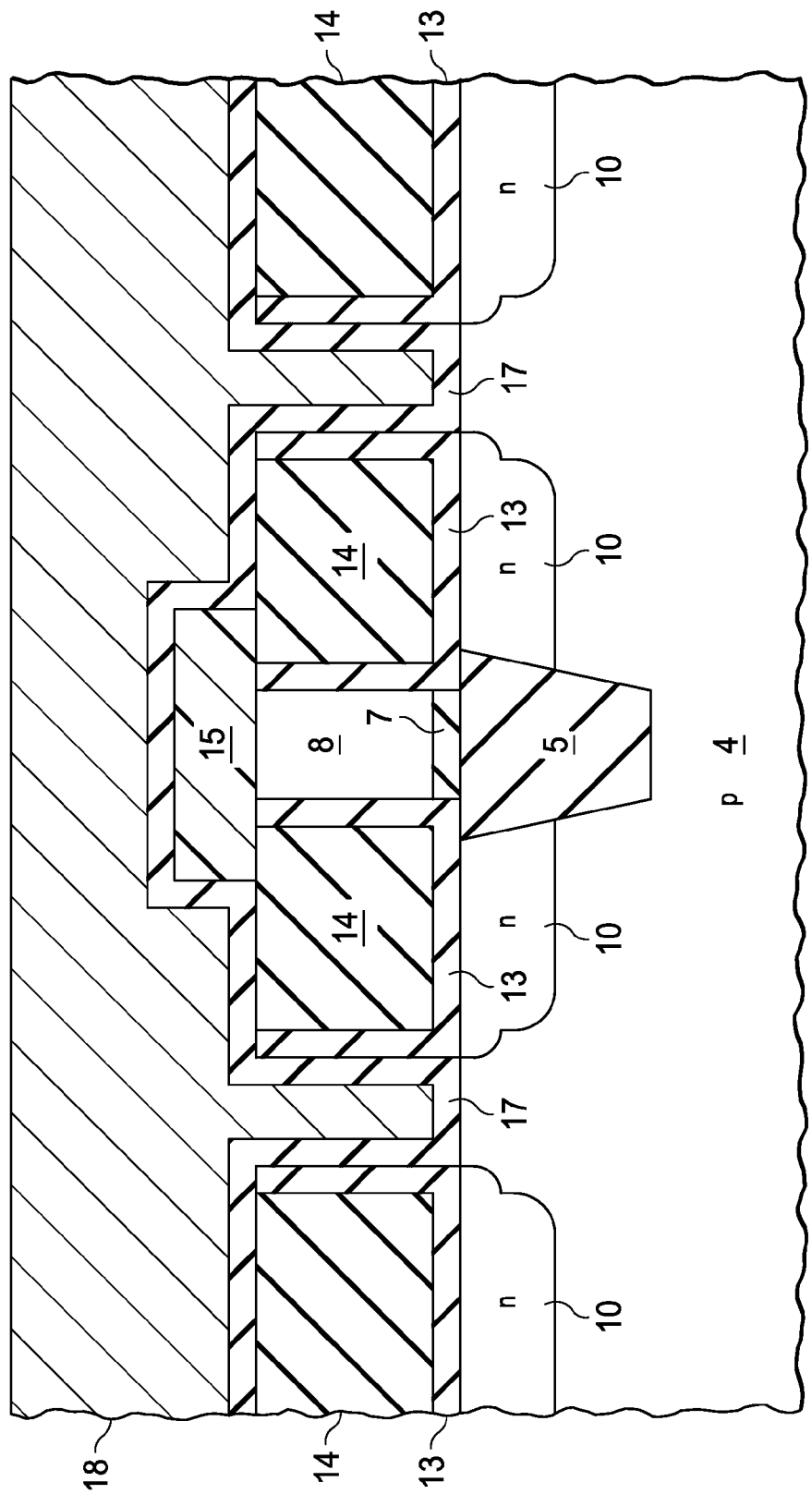
Figure 1G:
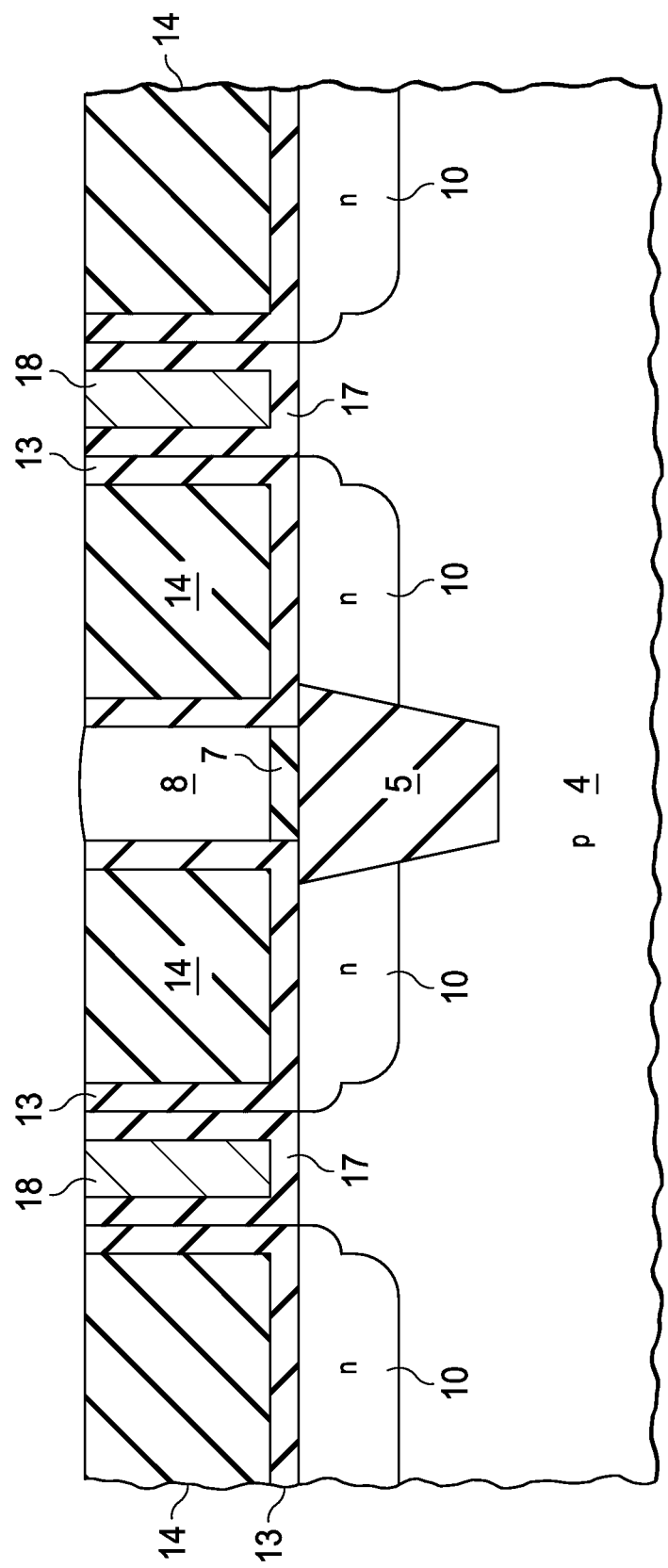

It is contemplated that this implementation of resistor 20R enables its efficient construction within the context of a metal gate high-k replacement gate manufacturing process, without multiple critical photolithography processes and in a manner that avoids potential shorting or metal gate degradation caused by silicidation. In addition, it is contemplated that the embedding of resistor 20R into substrate 24 will improve its ability to dissipate resistive heat as compared with conventional over-field resistors such as that shown in FIG. 1g.

Referring now to the cross-sectional views of FIGS. 3a through 3h, a method of fabricating an integrated circuit including resistor 20R and an instance of transistor 20T, according to a first embodiment of the invention, will now be described in detail. At the point in the process flow shown in FIG. 3a, STI isolation dielectric structures 25 have been formed in the conventional manner at selected locations of the surface of substrate 24. In this example, isolation dielectric structures 25 are formed of deposited silicon dioxide; as mentioned above, other insulating materials may alternatively be used. Photoresist layer 40 has been dispensed and photolithographically patterned and developed to form opening 41, which exposes one of isolation dielectric structures 25 at which resistor 20R will be formed according to this embodiment of the invention.

Figure 3A:
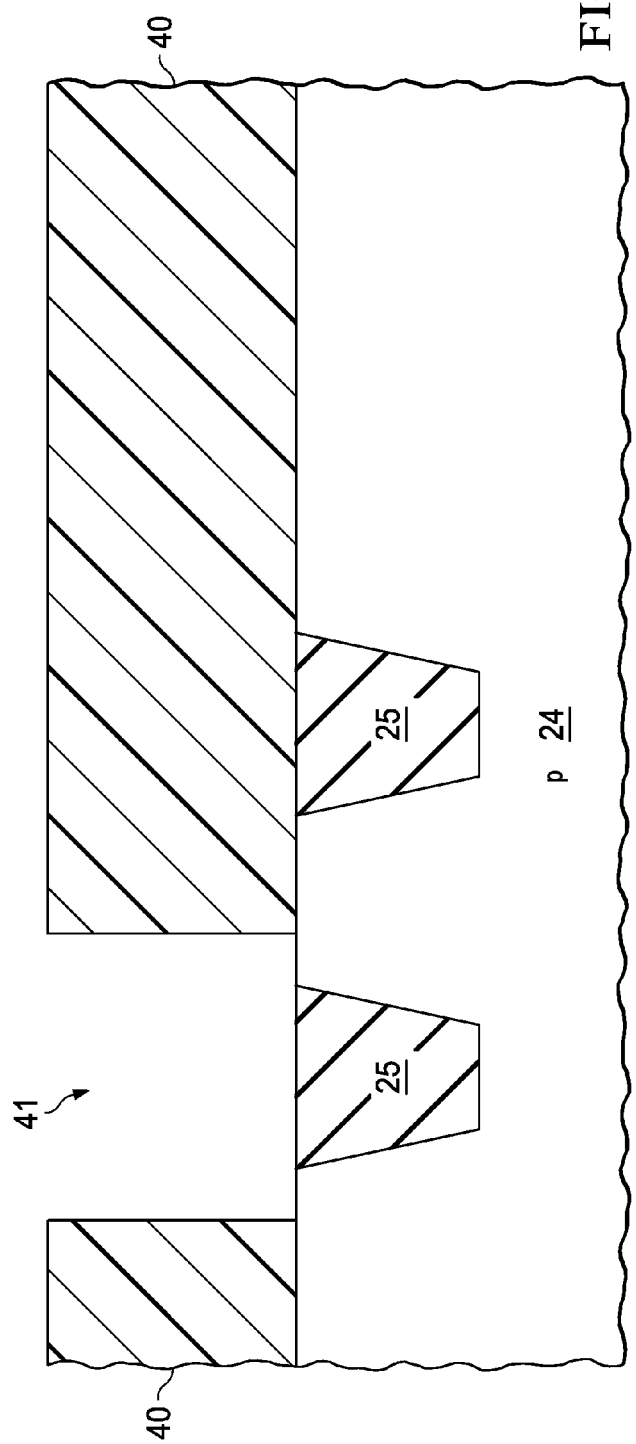
FIGS. 3a through 3h are cross-sectional views of the portion of the integrated circuit structure of FIGS. 2a and 2b at various stages in its manufacture according to an embodiment of the invention.
Figure 3B:
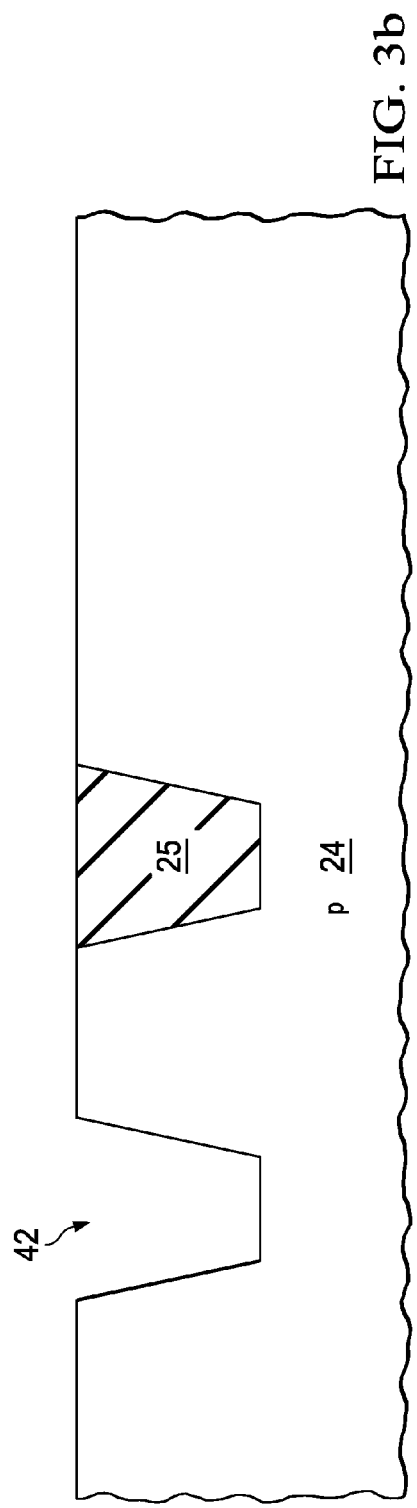
Figure 3C:
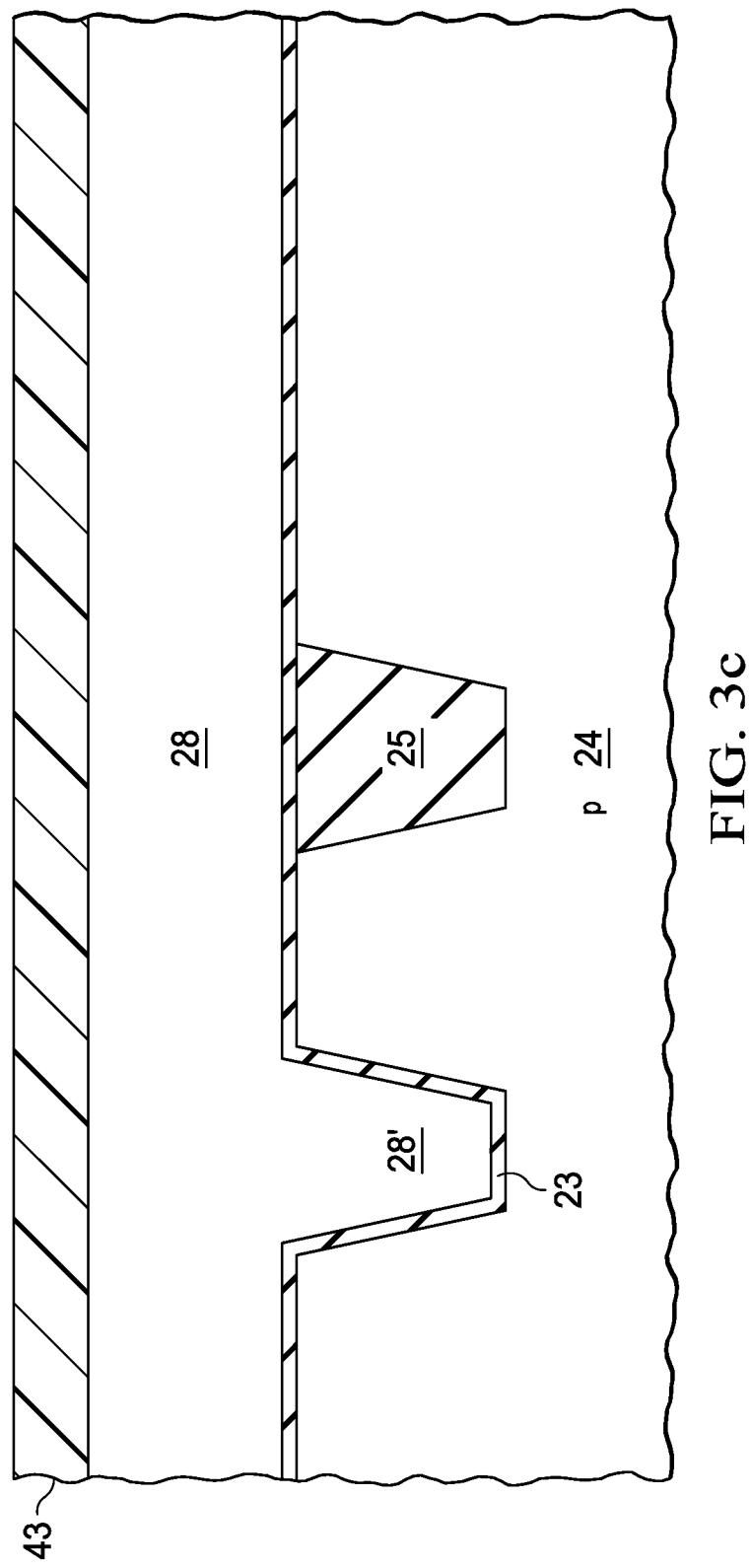

In this embodiment of the invention, the structure is then subjected to a selective oxide etch to remove the exposed isolation dielectric structure 25 and form trench 42 into the surface of substrate 24 at that location. This etch is selective in the sense that the etchants used react with silicon dioxide without substantially etching single-crystal silicon. This selectivity allows the mask step defining opening 41 to be non-critical, in that opening 41 can be relatively wide in comparison with minimum-size features such as transistor gates, and need not be precisely aligned with isolation dielectric structure 25 to be removed by this etch. The structure following this selective oxide etch and removal of photoresist layer 40 is shown in FIG. 3b, in which one isolation dielectric structure 25 has been removed and one remains.

Following the removal of isolation dielectric structure 25 at the location at which resistor 20R is to be formed, dummy gate dielectric layer 23 is then formed overall, for example by thermal oxidation of the surface of substrate 24 (including the surface of trench 42) or chemical vapor deposition (CVD) of silicon dioxide or silicon nitride, as desired. Dummy gate polysilicon layer 28 is then deposited overall, typically by CVD, to the desired thickness over the surface of substrate 24 at which transistor 20T will be formed, with a portion 28' of dummy gate polysilicon layer 28 that fills trench 42. This portion 28' will become the body of resistor 20R. Hard mask layer 43, for example of silicon nitride, is then deposited by CVD over dummy gate polysilicon layer 28, resulting in the structure shown in FIG. 3c.

Figure 3D:
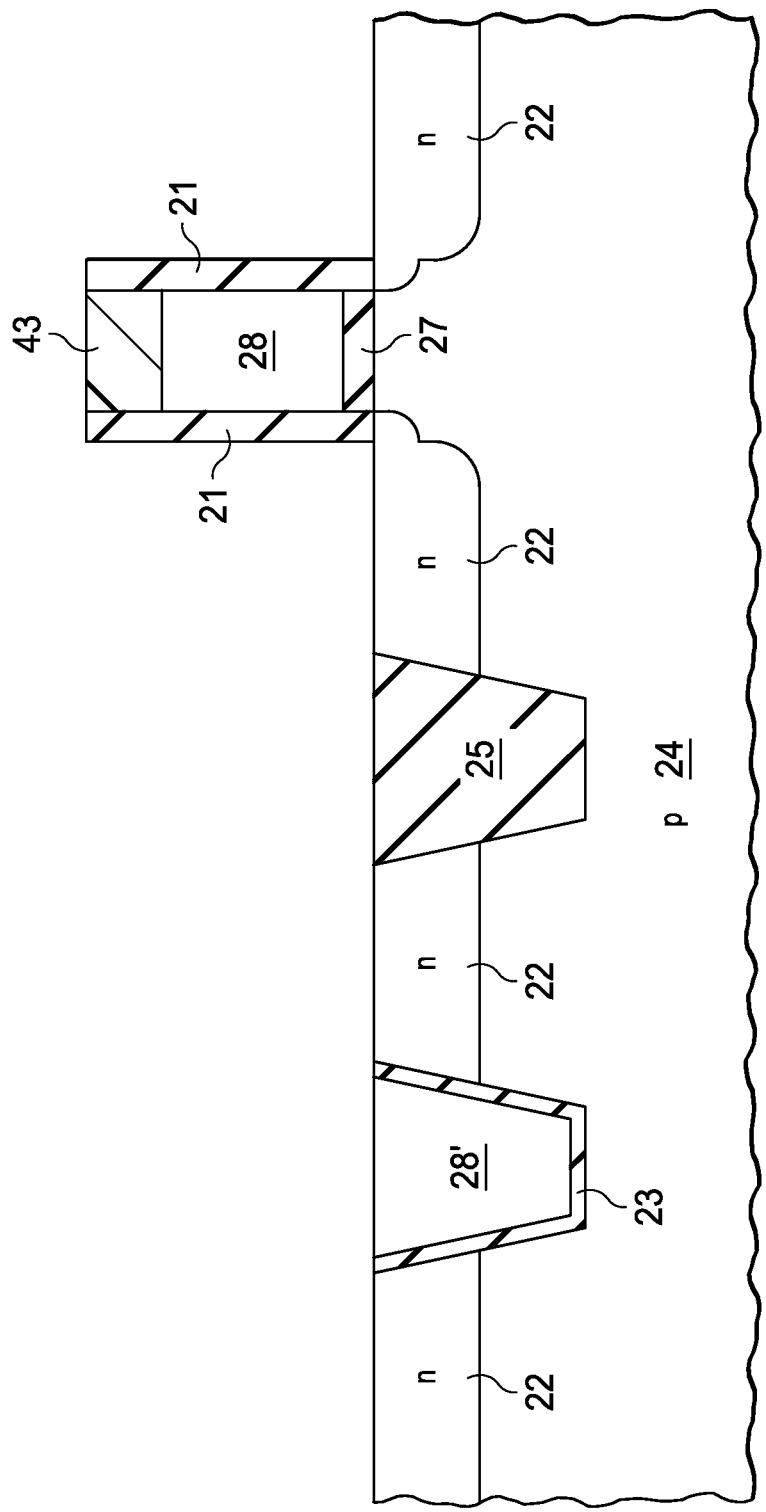

Photolithographic patterning of overlying photoresist (not shown) followed by a stack etch of hard mask layer 43 and dummy gate polysilicon layer 28 then forms a dummy gate structure at the eventual location of the gate electrode of transistor 20T. The stack etch may also etch dummy gate dielectric layer 23 from the surface of substrate 24 at locations from which dummy gate polysilicon layer 28 is removed; alternatively, dummy gate dielectric layer 23 may serve as an etch stop to the stack etch, and remain in place. After the stack etch, resistor polysilicon portion 28' within trench 42 will remain, as shown in FIG. 3d. Source/drain implant of n-type dopant (in this example of n-channel transistor 20T) is then performed. According to this embodiment of the invention, because resistor polysilicon portion 28' is exposed at this stage of the process, this source/drain implant can simultaneously dope portion 28' to the eventual dopant concentration of resistor 20R. In the example of FIG. 3d, source/drain regions 22 are formed in the conventional two-step manner to have lightly-doped drain extensions, with sidewall dielectric 21 formed on the sides of the dummy gate structure by conventional deposition and anisotropic etch after the lightly-doped drain extension implant and prior to the deeper heavier-dose source/drain implant.

Figure 3E:
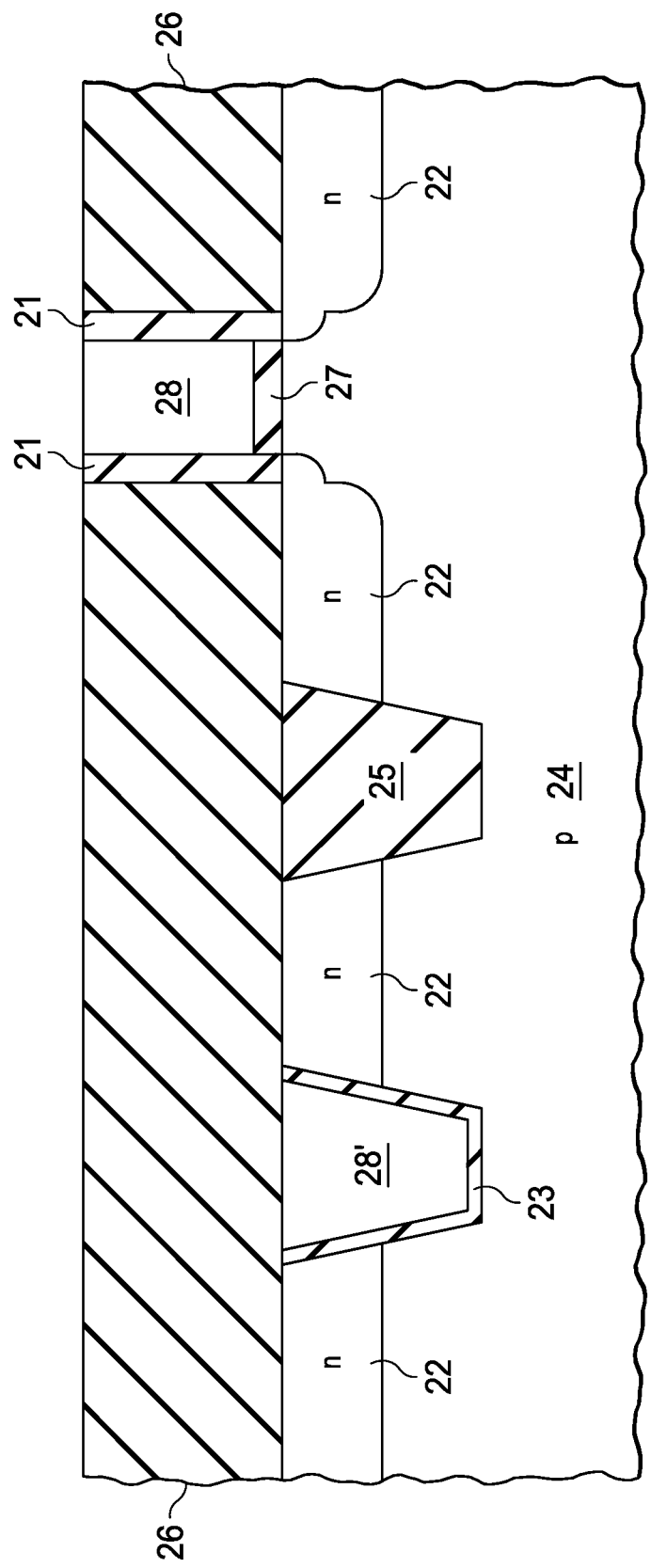
Figure 3F:
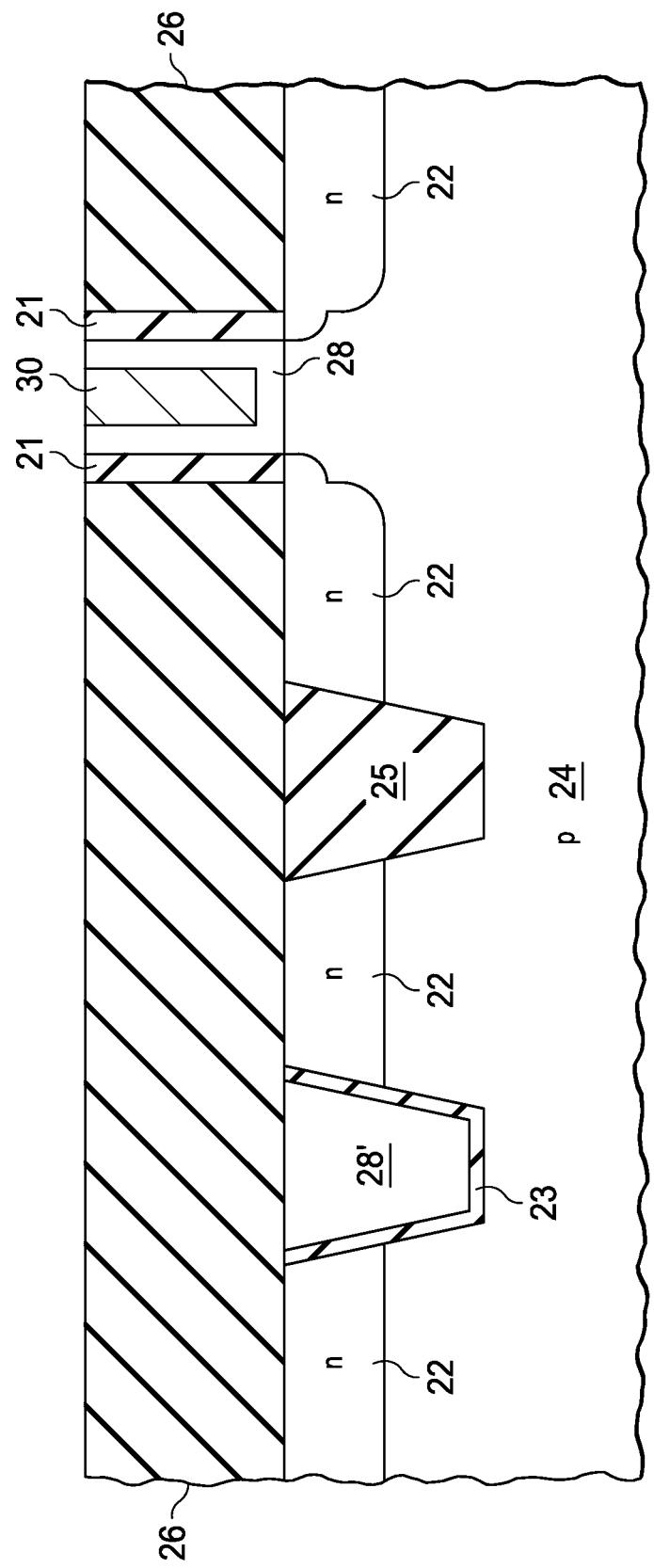
Figure 3G:
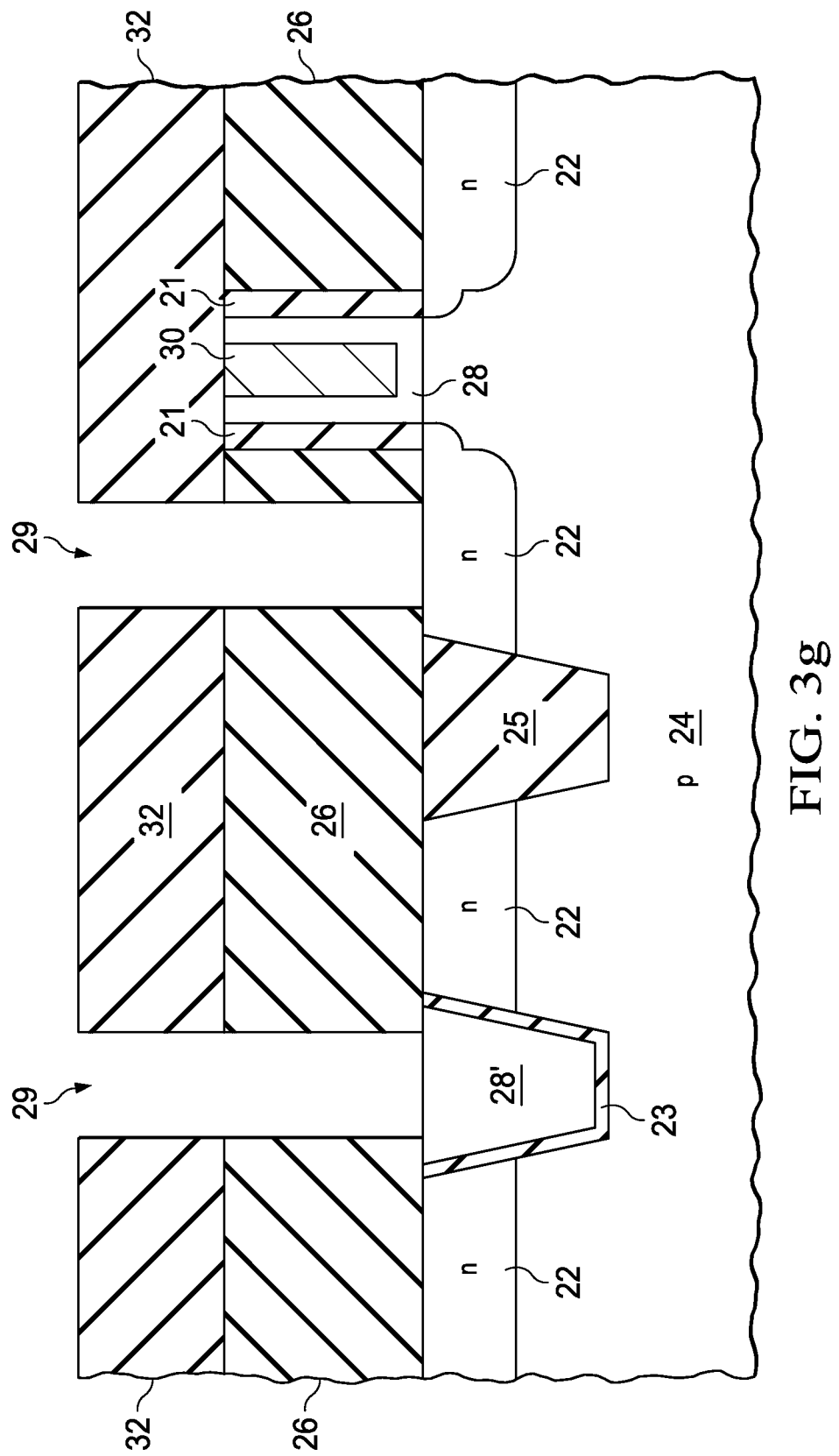

First interlevel dielectric layer 26, for example of silicon dioxide or silicon nitride, is then deposited overall by way of CVD. Chemical mechanical polishing (CMP) is then performed to planarize the structure, and to remove hard mask layer 42 overlying dummy gate polysilicon 28 at the dummy gate structure, the result of which is shown in FIG. 3e. As evident from FIG. 3e, the top surface of dummy gate polysilicon layer 28 at the location of the dummy gate structure is exposed by the CMP process, while resistor polysilicon portion 28' within trench 42 is protected by first interlevel dielectric layer 26. In similar manner as described above in connection with FIGS. 1e and 1f, this exposed portion of dummy gate polysilicon 28 and the underlying dummy gate dielectric 23 are then removed by way of a blanket etch. Deposition of high-k gate dielectric layer 27, for example by atomic layer deposition (ALD), followed by deposition of a metal layer to form metal gate 30 of transistor 20T, are then performed. As described above, it is contemplated that these deposition processes will also deposit the appropriate interface and barrier layers as conventional in the art for high-k metal gate transistors. Subsequent CMP removal of the excess portions of metal layer 30 and underlying high-k dielectric layer 27, from the surface of first interlevel dielectric layer 26, results in the structure of FIG. 3f. As evident from this FIG. 3f, resistor polysilicon portion 28' remains within trench 42, protected from the CMP by first interlevel dielectric layer 26.

Figure 3H:
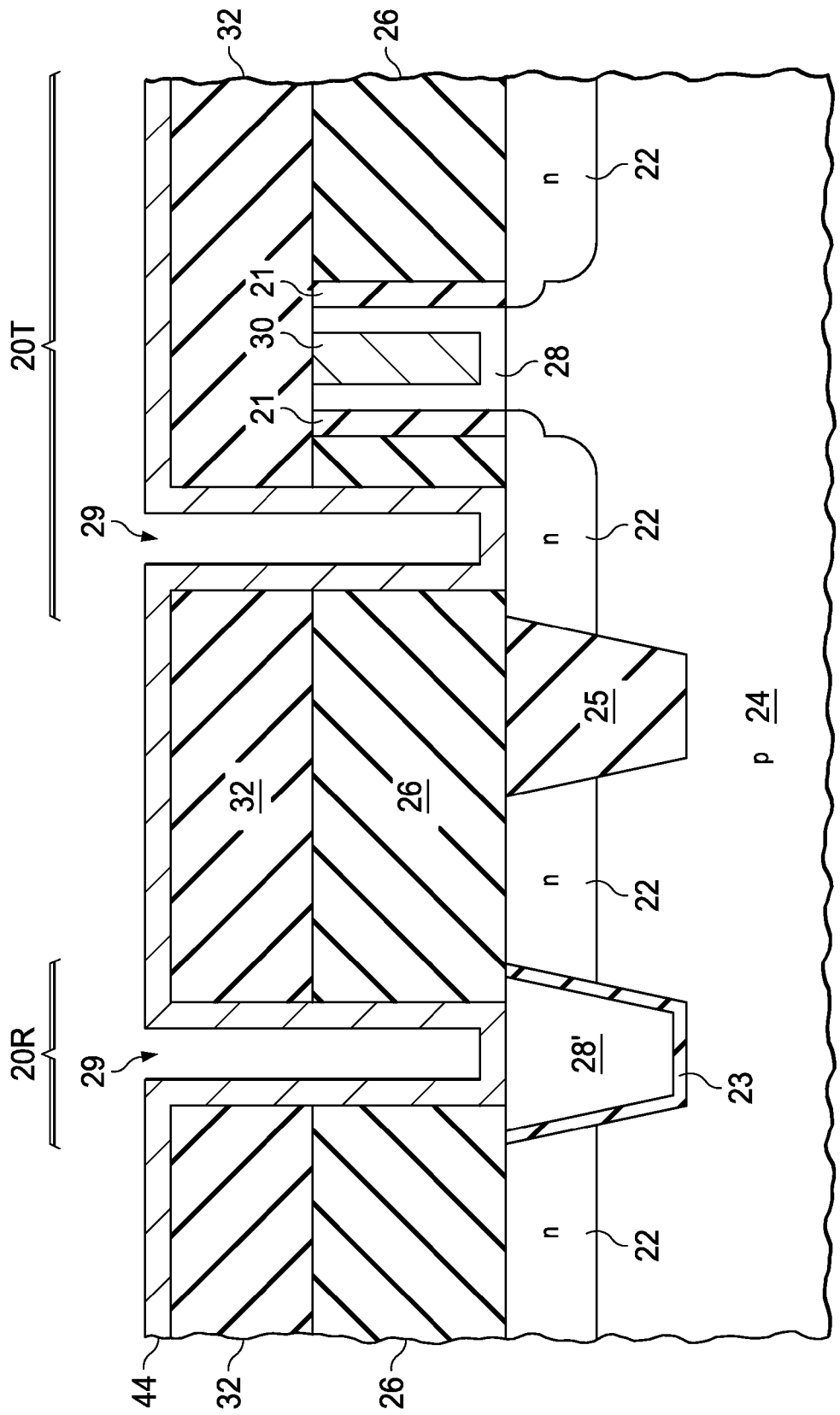

According to this embodiment of the invention, silicidation of contact locations of resistor polysilicon portion 28' is desired to ensure good ohmic contact. This silicidation is accomplished by first depositing second interlevel dielectric layer 32 overall, including over metal gate 30. Contact openings 29 are then etched through second interlevel dielectric layer 32 and first interlevel dielectric layer 26, exposing the contact locations of resistor polysilicon portion 28', and any locations of source/drain regions 22 that are desired to be silicided. Silicidation is then performed by the deposition of metal layer 44 overall, in contact with the exposed contact locations of resistor polysilicon portion 28' and any exposed locations of source/drain regions 22, as shown in FIG. 3h. A high temperature anneal reacts the deposited metal layer 44 with those silicon locations which it contacts (i.e., within contact openings 29), and is followed by a blanket etch of the unreacted portions of metal layer 44 to form silicide cladding 34 as shown in FIG. 2b. Because second interlevel dielectric layer 32 covers metal gate 30 during silicidation, the surface of metal gate 40 is protected from degradation that may result in the removal of the unreacted portions of metal layer 44.

The remainder of the manufacturing process continues from this point, including the formation of metal conductors making contact to silicide cladding 34 of resistor 20R and transistor 20T, the etching of additional contact openings (e.g., through second interlevel dielectric layer 32 to metal gate 30), and the formation of additional metal conductor levels as desired for the integrated circuit.

As evident from this description, resistor 20R can readily be formed in a manner that is compatible with the replacement gate process for the formation of high-k metal gate transistor 20R. According to this embodiment of the invention, only a single non-critical photolithography mask step is added to the conventional process flow, with doping of the polysilicon resistor material performed by the source/drain implant. In contrast to the manufacturing process flow described above relative to FIGS. 1a through 1g, in which one mask step is required for separately doping the resistor polysilicon and another mask step is required for blocking the dummy gate etch from removing the resistor polysilicon, it is contemplated that this embodiment of the invention results in an improved resistor structure that can be formed by a more robust and efficient manufacturing flow.

FIGS. 4a through 4d illustrate the manufacture of transistors 20T and 20R according to another embodiment of the invention, which is a variation on the embodiment of the invention described above relative to FIGS. 3a through 3h. At the stage in the manufacture according to this embodiment of the invention shown in FIG. 4a, hard mask layer 45, formed of silicon nitride in this example, has been patterned to expose the location of an instance of isolation dielectric structures 25, and a selective oxide etch has formed trench 42 into the surface of substrate 24 at that exposed location. As described above relative to FIG. 3b, this oxide etch is selective in the sense that it etches silicon dioxide preferentially to silicon. Because of the selectivity of this oxide etch, the opening in hard mask layer 45 need not be precisely positioned (i.e., does not define the width of trench 42), and as such can be photolithographically defined by a non-critical mask. Various etch chemistries and etch conditions for this selective oxide etch are well-known in the art.

Figure 4C:
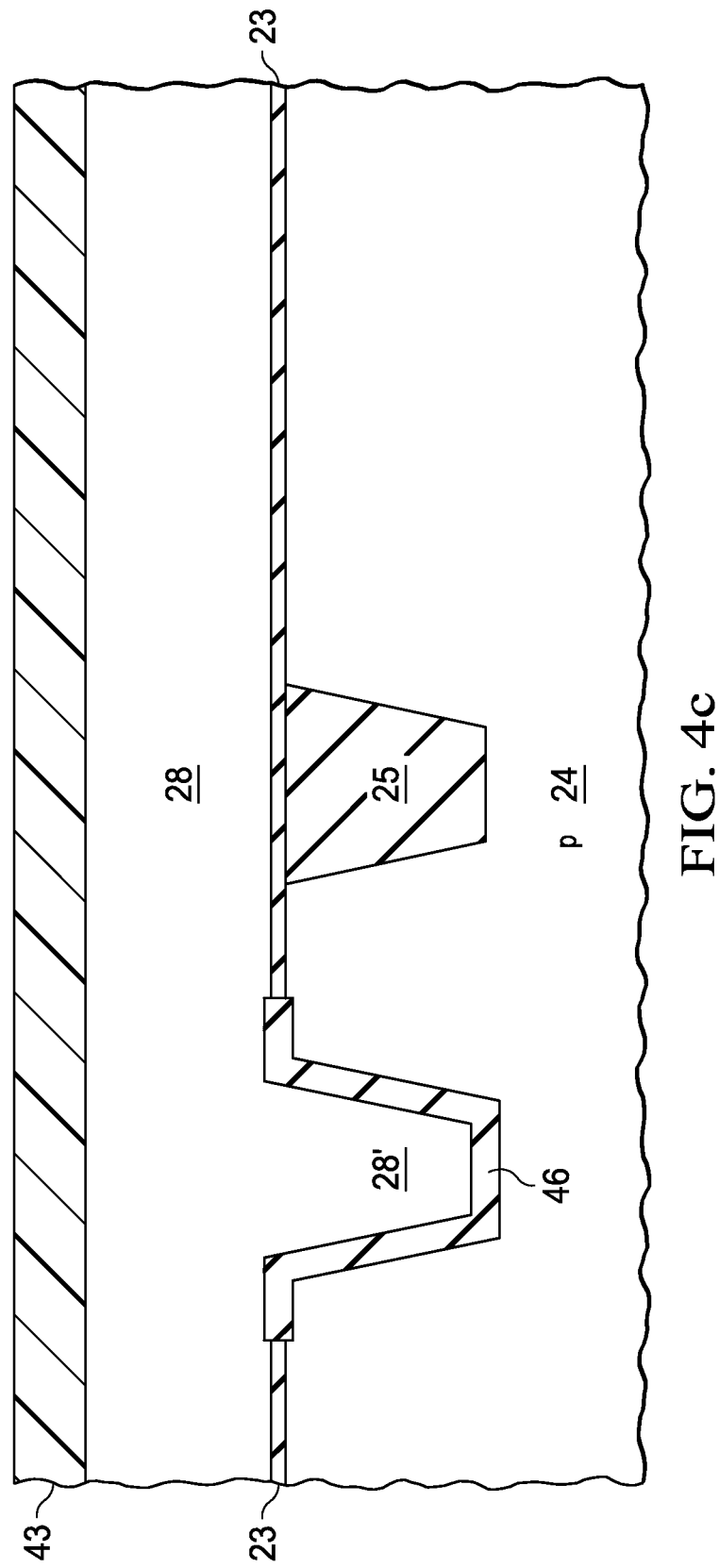

According to this embodiment of the invention, silicon dioxide film 46 is then formed by thermal oxidation at the surface of trench 42 and at the neighboring exposed silicon surface of substrate 24, as shown in FIG. 4b. Silicon nitride hard mask layer 45 prevents the oxidation of other portions of the surface of substrate 24, as known in the art. Thermal oxide film 46 is contemplated to be substantially thicker than dummy gate dielectric 23. For example, if dummy gate dielectric 23 is on the order of 50 to 100 Å, it is contemplated that thermal oxide film 46 will be at least as thick as 100 Å, for example ranging from 150 to 250 Å. Hard mask layer 45 is removed, and polysilicon layer 28 is then deposited, followed by the deposition of hard mask layer 43 which will be used in defining the dummy gate electrode for transistor 20T in this replacement gate process. As shown in FIG. 4c at this stage in the process, portion 28' of polysilicon layer 28 fills trench 42, overlying thick oxide film 46 at that location, and will serve as the body of resistor 20R as described above.

Figure 4D:
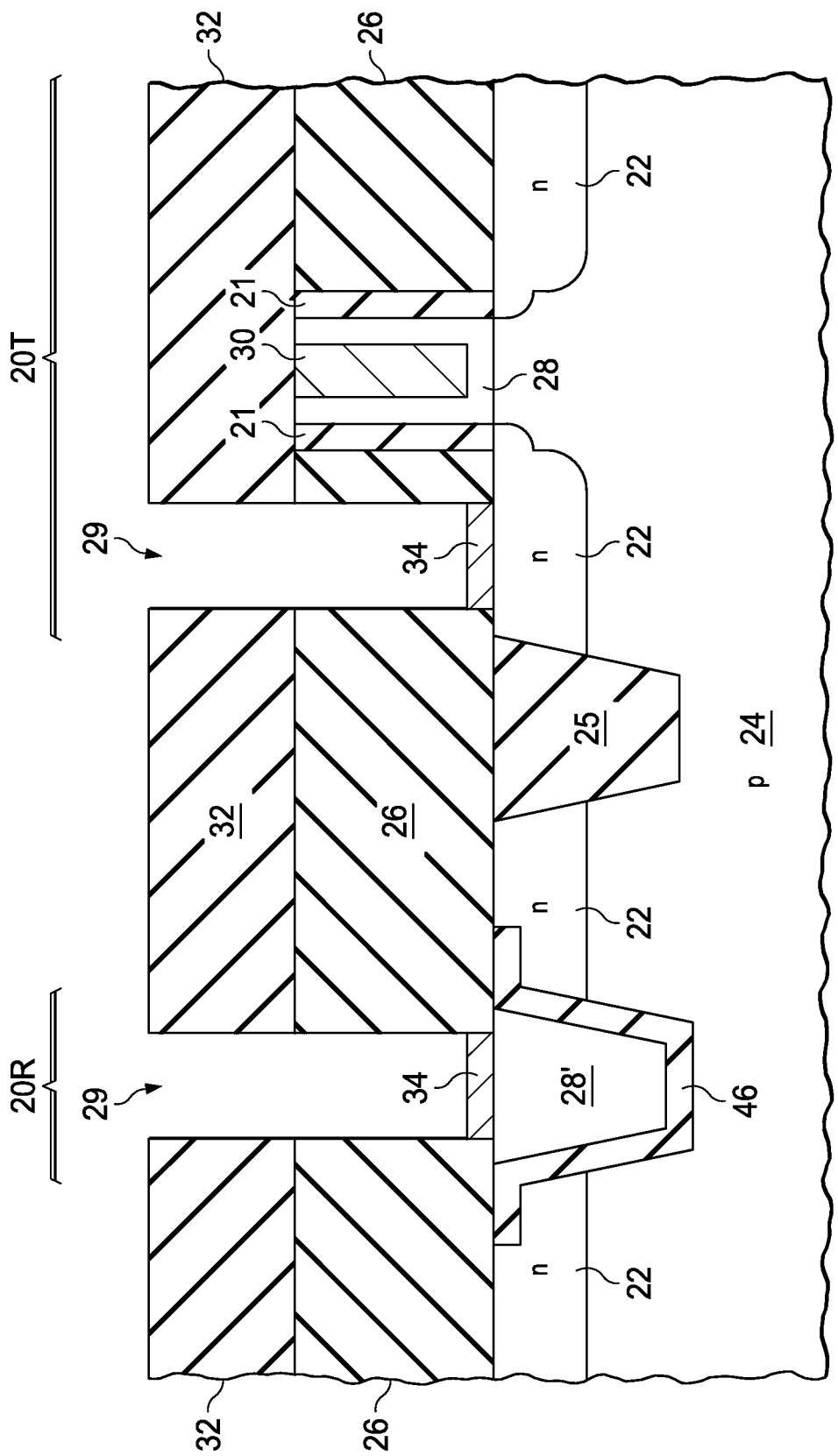

According to this embodiment of the invention, transistor 20T and resistor 20R are then completed in the manner described above relative to FIGS. 3d through 3h. The resulting structure is shown in FIG. 4d, showing metal gate 30 and high-k gate dielectric 27 at the location of transistor 20T, and silicide cladding 34 at the surface of resistor polysilicon 28' and source/drain region 22 at contact openings 29, as before. The construction of resistor 20R according to this embodiment of the invention includes thermal oxide film 46 that is substantially thicker than dummy gate dielectric 23 in the example of FIG. 2b. Resistor 20R according to the embodiment of the invention shown in FIG. 4d thus provides additional electrical isolation between resistor 20R and substrate 24, and perhaps a higher resistance value per unit length (assuming a constant width of isolation dielectric structure 25 and thus trench 42 between the two cases). This embodiment of the invention also provides the advantages in compatible and efficient fabrication and improved thermal conductivity, etc., as described above relative to the first embodiment of the invention.

Figure 5A:
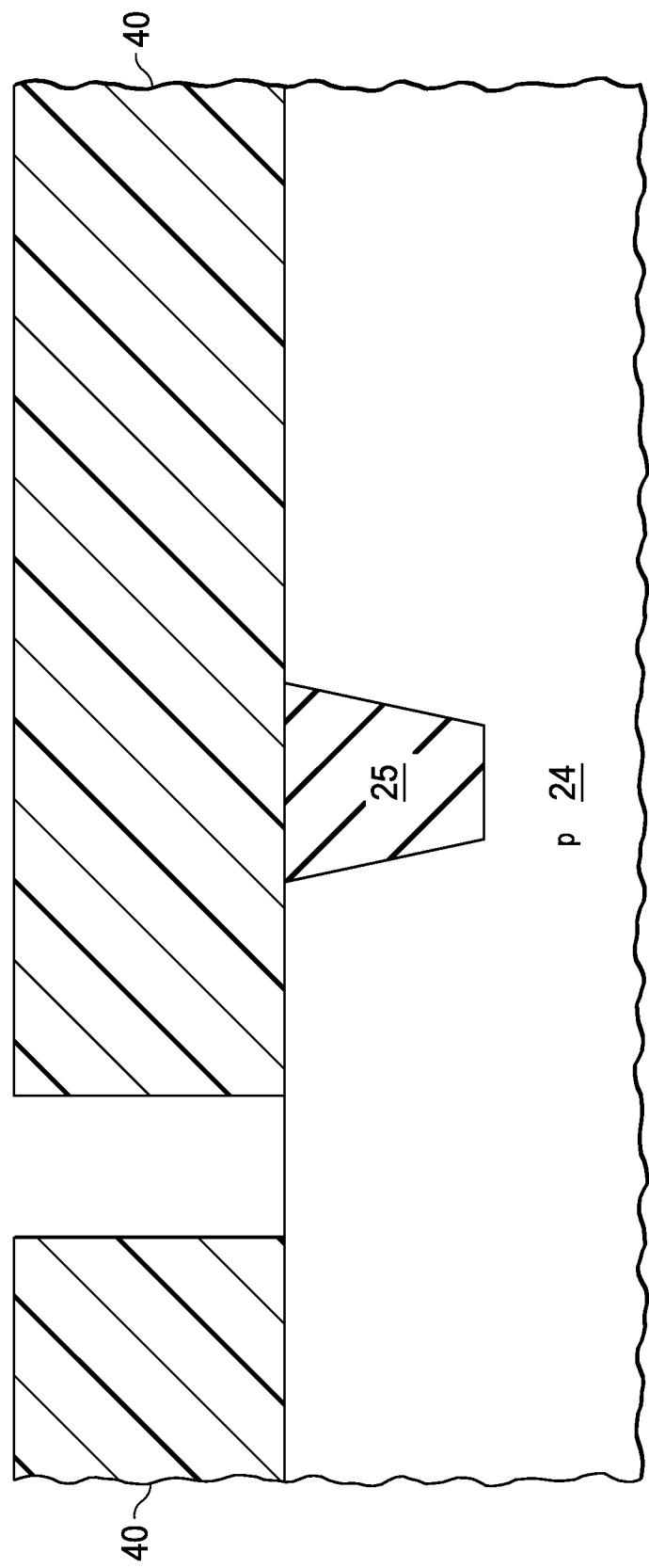
FIGS. 5a through 5d are cross-sectional views of a portion of an integrated circuit structure at various stages in its manufacture according to another embodiment of the invention.
Figure 5B:
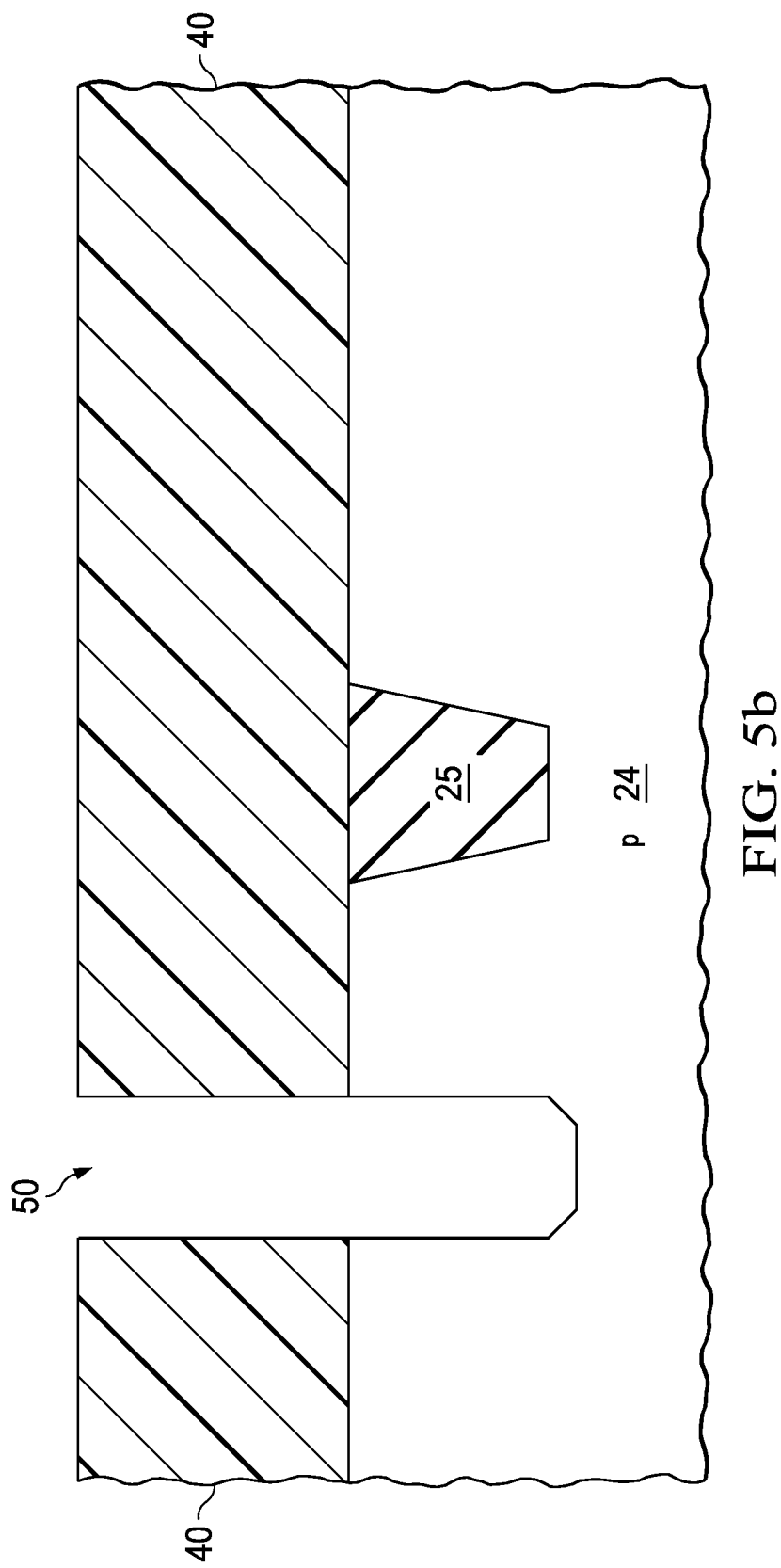
Figure 5C:
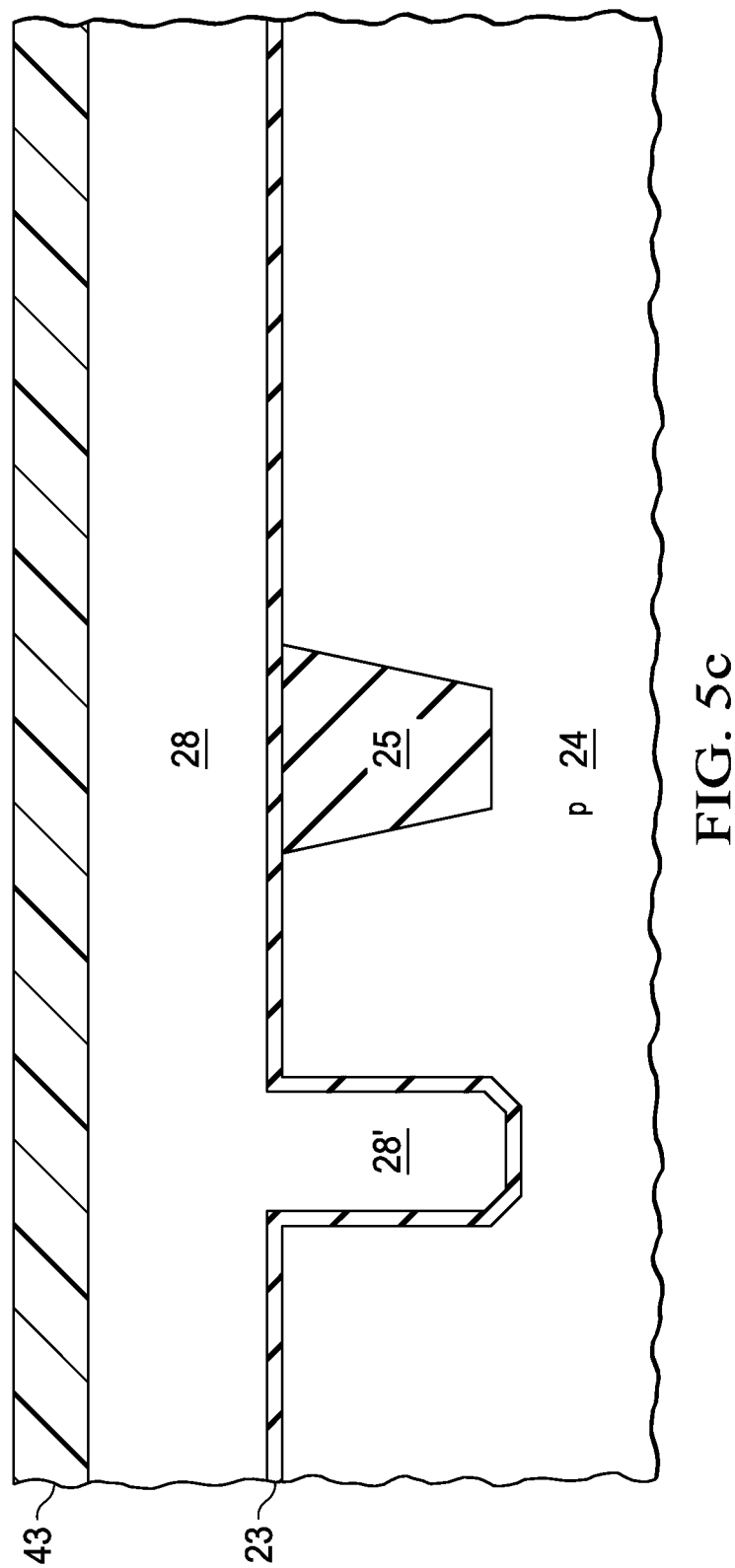

FIGS. 5a through 5d illustrate the manufacture of transistors 20T and 20R according to another embodiment of the invention, which is another variation on the embodiment of the invention described above relative to FIGS. 3a through 3h. At the stage in the manufacture according to this embodiment of the invention shown in FIG. 5a, photoresist mask layer 40 has been patterned to expose a location of the surface of substrate 24. Isolation dielectric structures 25 have been previously formed at this stage of the process, and underlie the remaining portions of photoresist mask layer 40. According to this embodiment of the invention, photoresist mask layer 40 defines the location of a trench into substrate 24 that is to contain the body of resistor 20R. Following the patterning of photoresist 40, substrate 24 is etched at the exposed location to form trench 50 into substrate 24, as shown in FIG. 5b. It is contemplated that this silicon etch will be a conventional plasma silicon etch, using the etch chemistry and plasma conditions suitable for forming trench 50 of the desired depth and profile. In this embodiment of the invention, the photolithographic mask used to define the pattern of photoresist 40, which directly defines the location of trench 50, can be considered a "critical" mask step.

Similarly as described above relative to FIG. 3c, after the etch of trench 50 into substrate 24 at the location at which resistor 20R is to be formed, dummy gate dielectric layer 23 is formed overall, for example by thermal oxidation of the surface of substrate 24 (including the surface of trench 50) or by CVD of silicon dioxide or silicon nitride, as desired. Dummy gate polysilicon layer 28 is then deposited overall, typically by CVD, to the desired thickness over the surface of substrate 24 at which transistor 20T will be formed, resulting in polysilicon portion 28' within trench 50 and overlying dummy gate dielectric 23. This polysilicon portion 28' will become the body of resistor 20R. Hard mask layer 43, for example of silicon nitride, is then deposited by CVD over dummy gate polysilicon layer 28, resulting in the structure shown in FIG. 5c.

Figure 5D:
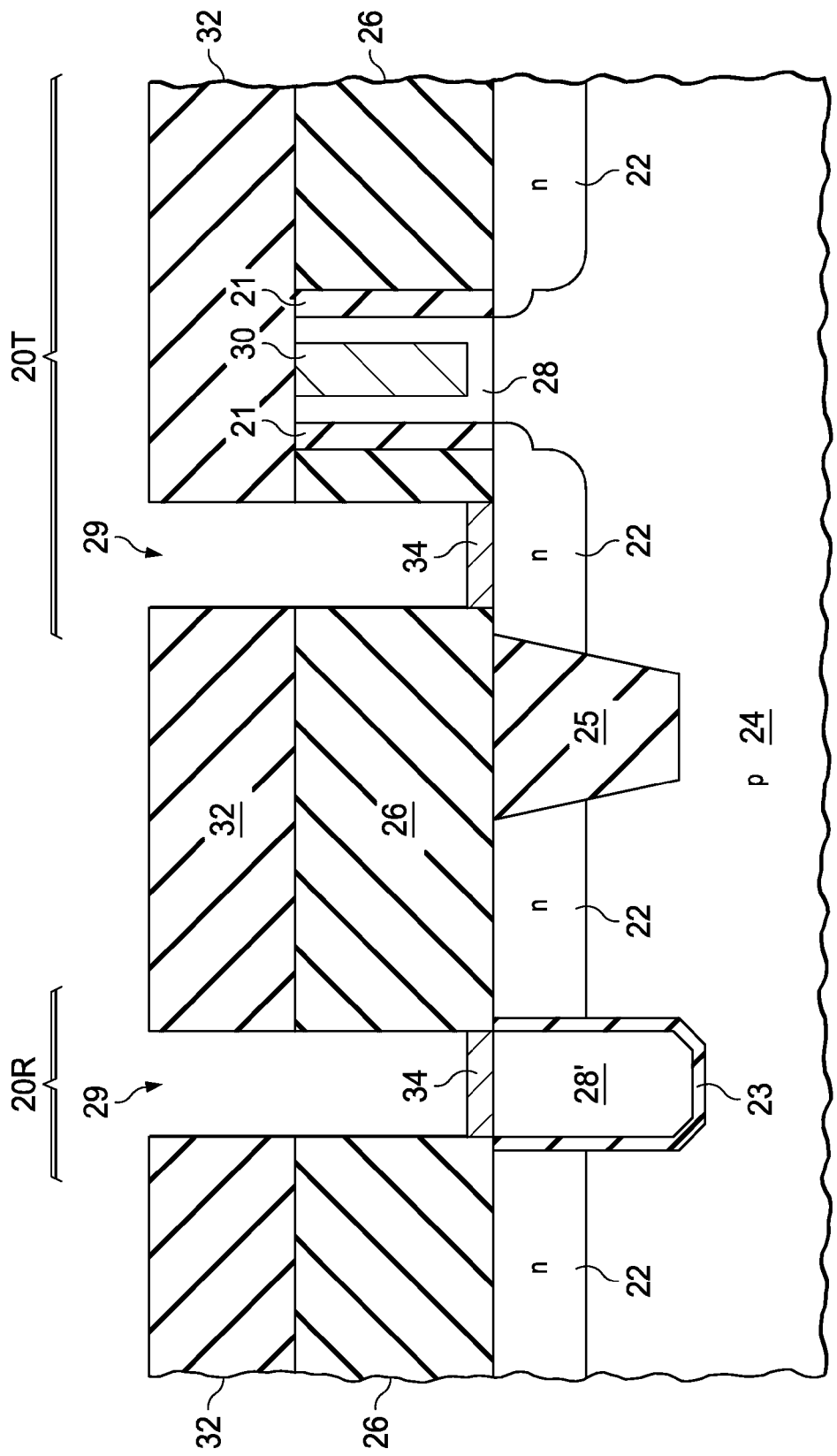

According to this embodiment of the invention, transistor 20T and resistor 20R are then completed in the manner described above relative to FIGS. 3d through 3h, resulting in the structure shown in FIG. 5d. Metal gate 30 and high-k gate dielectric 27 are formed at the gate electrode location of transistor 20T, with silicide cladding 34 present at the surface of resistor polysilicon 28' and source/drain region 22 at contact openings 29, as before. This embodiment of the invention provides the same advantages in compatible and efficient fabrication and improved thermal conductivity, etc., as described above relative to the embodiments of the invention described above. However, the shape of polysilicon portion 28' of resistor 20R according to this embodiment of the invention is defined by an etch into single-crystal silicon rather than by an oxide etch of an instance of isolation dielectric structure 25 in the embodiments of FIGS. 3a through 3h and 4a through 4d. While a critical photolithographic mask is used to define the location of the trench into which the eventual resistor body is formed, according to this embodiment of the invention, only one such critical mask step is required, and that critical mask step results in more precise placement and control of the cross-sectional area of polysilicon portion 28', and thus more precise control of the resistance value of resistor 20R.

Figure 6A:
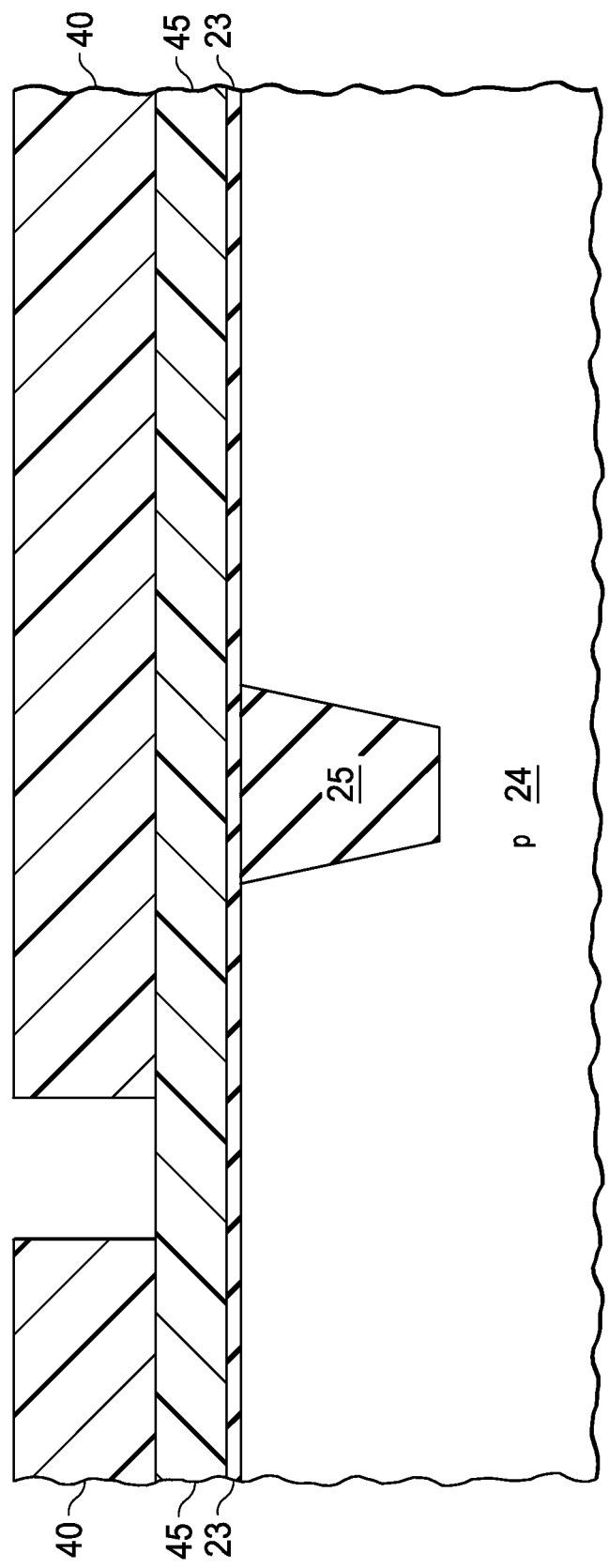
FIGS. 6a through 6d are cross-sectional views of a portion of an integrated circuit structure at various stages in its manufacture according to another embodiment of the invention.
Figure 6B:
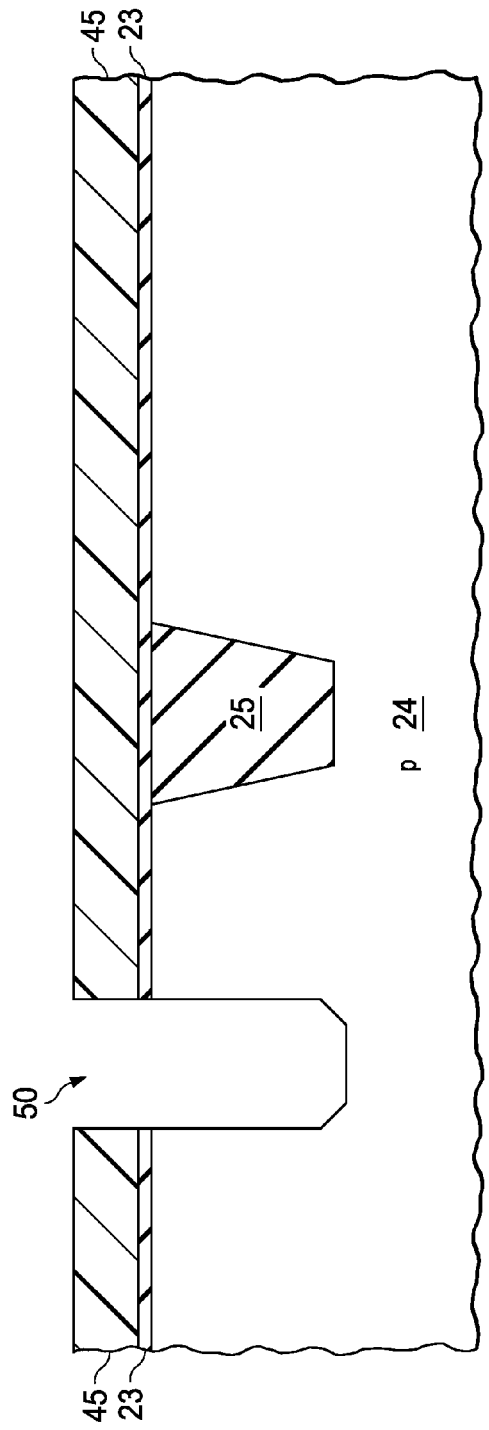

FIGS. 6a through 6d illustrate the manufacture of transistors 20T and 20R according to another embodiment of the invention, which is a variation similar to that described above in connection with FIGS. 4a through 4d, as applied to the embodiment of the invention described above relative to FIGS. 5a through 5d. At the manufacturing stage shown in FIG. 6a, dummy gate dielectric 23 and hard mask layer 45 (e.g., of silicon nitride) have been formed over the structure. Photoresist layer 40 has been patterned and developed, to form an opening at the location at which resistor body 20R is to be formed. Hard mask layer 45 and perhaps also dummy gate dielectric 23 are etched using photoresist 40 as a mask, following which photoresist 40 is stripped, transferring the pattern from photoresist 40 to hard mask layer 45. A silicon etch is then performed to etch the portion of substrate 24 at the opening in hard mask layer 45; the etch chemistry and plasma conditions for this etch are selected to form trench 50 into the surface of substrate 24 to the desired depth and with the desired profile. The resulting structure after the etch of trench 50 is shown in FIG. 6b. Alternatively, a stack etch may be performed to etch hard mask layer 45, dummy gate dielectric 23, and substrate 24 to form trench 50, using patterned photoresist 40 as the mask for the etch of all three materials.

Figure 6C:
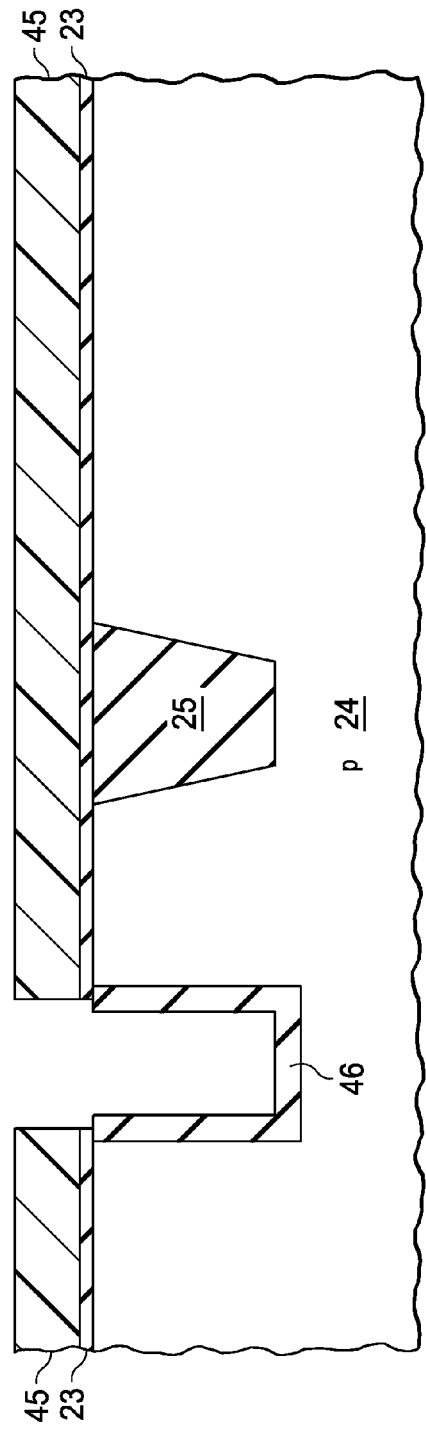
Figure 6D:
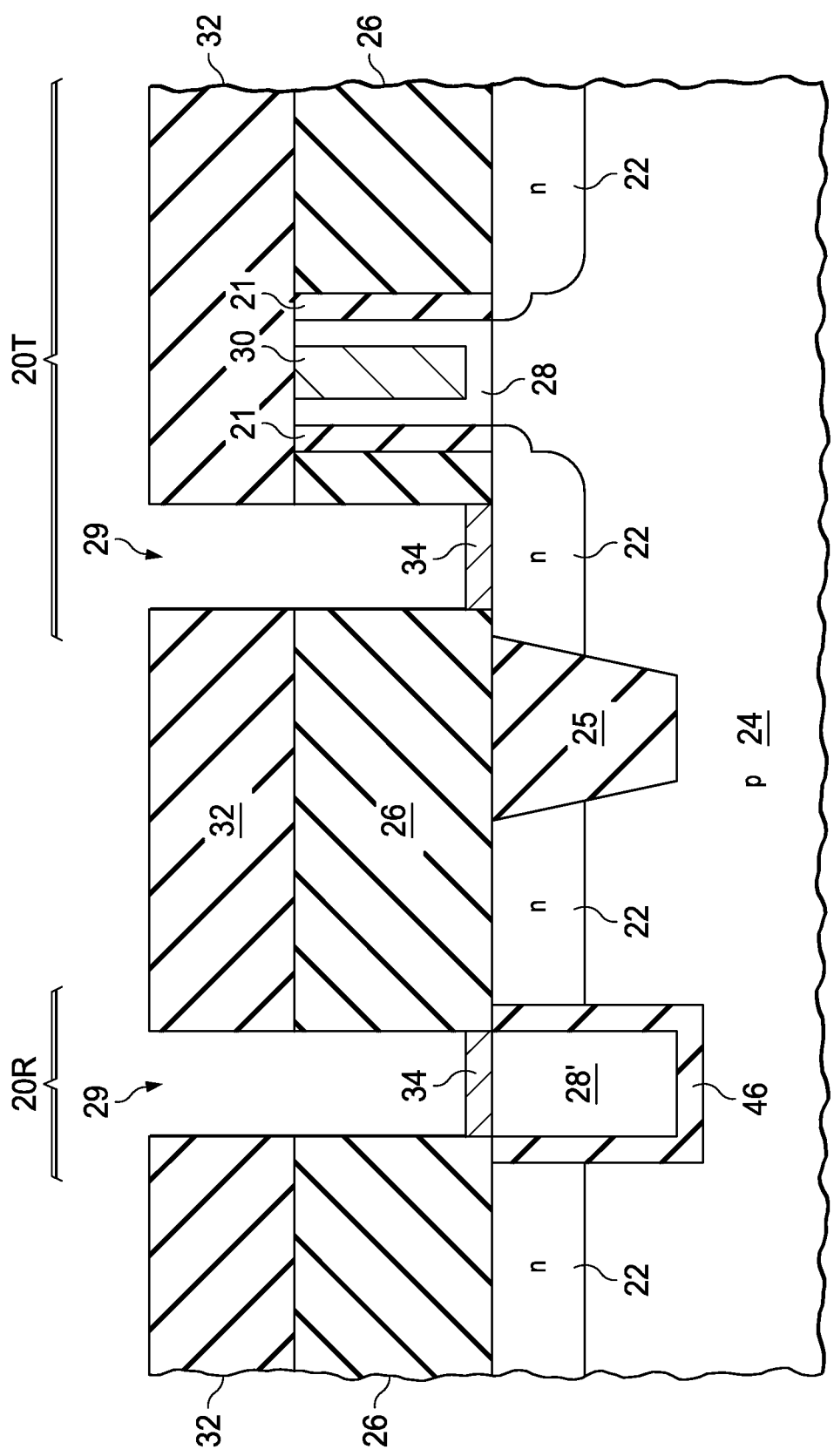

Following the etch of trench 50, according to this embodiment of the invention, silicon dioxide film 46 is then formed at the surface of trench 42 and neighboring exposed silicon at the surface of substrate 24, by thermal oxidation. Silicon nitride hard mask layer 45 prevents the oxidation of other portions of the surface of substrate 24, as shown in FIG. 6c. Thermal oxide film 46 is contemplated to be substantially thicker than dummy gate dielectric 23. According to one example, dummy gate dielectric 23 is on the order of 50 to 100 Å and thermal oxide film 46 is at least as thick as 100 A, for example ranging between 150 to 250 A. Following the formation of thermal oxide film 46 as shown in FIG. 6c, the process flow described above relative to FIGS. 4c and 4d, and FIGS. 3d through 3h, is then carried out according to this embodiment of the invention. The resulting structure for this embodiment of the invention is shown in FIG. 6d, in which metal gate 30, high-k gate dielectric 27, and source/drain regions 22 are formed at the location of transistor 20T, resistor polysilicon 28' is disposed within trench 50, and silicide cladding 34 is present at the surface of resistor polysilicon 28' and source/drain region 22 at contact openings 29. Resistor 20R in this embodiment of the invention differs from that shown in FIG. 5d by the increased thickness of the dielectric layer underlying resistor polysilicon 28'. The thicker thermal oxide film 46 present in this embodiment of the invention is contemplated to provide additional electrical isolation between resistor 20R and substrate 24, and perhaps a higher resistance value per unit length (assuming a constant width of isolation dielectric structure 25 and thus trench 42 between the two cases), than that of the embodiment of FIG. 5d. This embodiment of the invention provides the advantages of compatible and efficient fabrication and improved thermal conductivity, as mentioned in connection with the other embodiments of the invention. And as in the embodiment of the invention described above relative to FIGS. 5a through 5d, only the single critical photolithographic mask for defining the location of the trench into which the eventual resistor body is formed is required in this process, providing precise placement and control of the polysilicon portion 28' forming resistor 20R.

As evident from this description and according to each of the embodiments of this invention, a polysilicon resistor can readily be formed in a manner that is compatible with the replacement gate process for the formation of modern high-k metal gate transistors. The embedding of this polysilicon resistor structure into a trench in the underlying silicon, rather than disposed over field oxide as in conventional structures, is also contemplated to improve thermal dissipation of resistive heat generated by the resistor structure, improving overall circuit performance and reliability.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit structure formed at a semiconducting surface of a body, comprising:
   interlevel dielectric structures disposed at selected locations of the surface;
   a transistor comprising:
      source/drain regions of a first conductivity type formed into a region of the surface of a second conductivity type, the second conductivity type opposite to the first conductivity type, the source/drain regions spaced apart from one another to define a first channel region at the surface therebetween;
      high-k dielectric material overlying at least a portion of the surface of the first channel region within a gap between interlevel dielectric structures;
      a metal gate material, comprised of a metal or metal compound and disposed over the high-k dielectric material within the gap; and
   a resistor structure comprising a polysilicon element disposed within a trench disposed in the surface, and underlying one of the interlevel dielectric structures.

2. The structure of claim 1, wherein the resistor structure further comprises:

at least one metal silicide clad portion at a surface of the polysilicon element, and in contact with an overlying metal conductor.

3. The structure of claim 1, wherein the resistor structure further comprises:

a dielectric film disposed between the polysilicon element and the surface of the trench.

4. The structure of claim 1, further comprising:

at least one isolation dielectric structure disposed at the surface adjacent to one of the source/drain regions;

wherein the polysilicon element has a cross-sectional shape similar to a cross-sectional shape of one of the isolation dielectric structure.

* * * * *